United States Patent
Liao et al.

(10) Patent No.: US 11,018,215 B2
(45) Date of Patent: May 25, 2021

(54) PACKAGE AND MANUFACTURING METHOD THEREOF

(71) Applicant: Taiwan Semiconductor Manufacturing Co., Ltd., Hsinchu (TW)

(72) Inventors: Wen-Shiang Liao, Miaoli County (TW); Chih-Hang Tung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 16/354,142

(22) Filed: Mar. 14, 2019

(65) Prior Publication Data

US 2020/0295121 A1    Sep. 17, 2020

(51) Int. Cl.

| | |
|---|---|
| *H01L 23/495* | (2006.01) |
| *H01L 49/02* | (2006.01) |
| *H01L 23/31* | (2006.01) |
| *H01L 23/498* | (2006.01) |
| *H01F 27/24* | (2006.01) |
| *H01F 27/28* | (2006.01) |
| *H01L 23/00* | (2006.01) |
| *H01L 21/48* | (2006.01) |
| *H01L 21/56* | (2006.01) |

(Continued)

(52) U.S. Cl.
CPC ............ *H01L 28/10* (2013.01); *H01F 27/24* (2013.01); *H01F 27/2804* (2013.01); *H01F 41/041* (2013.01); *H01L 21/486* (2013.01); *H01L 21/4857* (2013.01); *H01L 21/561* (2013.01); *H01L 21/565* (2013.01); *H01L 21/568* (2013.01); *H01L 21/6835* (2013.01); *H01L 23/3128* (2013.01); *H01L 23/49827* (2013.01); *H01L 23/49838* (2013.01); *H01L 24/19* (2013.01); *H01L 24/20* (2013.01); *H01L 24/97* (2013.01); *H01F 2027/2809* (2013.01); *H01L 2224/211* (2013.01); *H01L 2224/221* (2013.01); *H01L 2224/95001* (2013.01); *H01L 2924/1427* (2013.01); *H01L 2924/19042* (2013.01)

(58) Field of Classification Search
CPC ... H01L 28/10; H01L 23/49827; H01F 27/24; H01F 27/2804; H01F 41/041
USPC .................................................. 257/668, 724
See application file for complete search history.

(56) References Cited

U.S. PATENT DOCUMENTS

| | | | |
|---|---|---|---|
| 6,249,039 B1 * | 6/2001 | Harvey ............... | H01F 17/0006 257/528 |
| 7,049,692 B2 * | 5/2006 | Nishimura .......... | H01L 23/3128 257/686 |
| 9,000,584 B2 | 4/2015 | Lin et al. | |

(Continued)

*Primary Examiner* — Nitin Parekh
(74) *Attorney, Agent, or Firm* — JCIPRNET

(57) ABSTRACT

A package includes a first redistribution structure, a die, an encapsulant, a second redistribution structure, and an inductor. The die is disposed on the first redistribution structure. The encapsulant laterally encapsulates the die. The second redistribution structure is over the die and the encapsulant. The inductor includes a first portion, a second portion, and a third portion. The first portion is embedded in the first redistribution structure. The second portion is embedded in the encapsulant and is connected to the first and third portions of the inductor. The third portion is embedded in the second redistribution structure.

20 Claims, 35 Drawing Sheets

(51) Int. Cl.
  *H01L 21/683*  (2006.01)
  *H01F 41/04*  (2006.01)

(56)     References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,190,389 B2 * | 11/2015 | Meyer-Berg | H01L 23/49861 |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,799,721 B2 * | 10/2017 | Kuo | H01L 28/10 |
| 10,411,766 B2 * | 9/2019 | Yeh | H01F 27/40 |
| 2003/0070282 A1 * | 4/2003 | Hiatt | H01F 41/34 29/602.1 |
| 2007/0075819 A1 * | 4/2007 | Okuzawa | H01F 17/062 336/200 |
| 2010/0066830 A1 * | 3/2010 | DeKeyser | H04N 5/77 348/143 |
| 2011/0204509 A1 * | 8/2011 | Lin | H01L 24/20 257/692 |
| 2013/0127578 A1 * | 5/2013 | Kuo | H01F 5/00 336/200 |
| 2014/0071636 A1 * | 3/2014 | Sturcken | H05K 1/0298 361/748 |
| 2015/0028487 A1 * | 1/2015 | Meyer-Berg | H01L 24/82 257/773 |
| 2015/0228416 A1 * | 8/2015 | Hurwitz | H01G 4/1209 361/763 |
| 2016/0100489 A1 * | 4/2016 | Costa | H01L 25/0655 361/764 |
| 2016/0307991 A1 * | 10/2016 | Kuo | H01L 23/5227 |
| 2018/0269708 A1 * | 9/2018 | Yeh | H01F 27/2804 |
| 2019/0295967 A1 * | 9/2019 | Darmawikarta | H01F 1/14 |

* cited by examiner

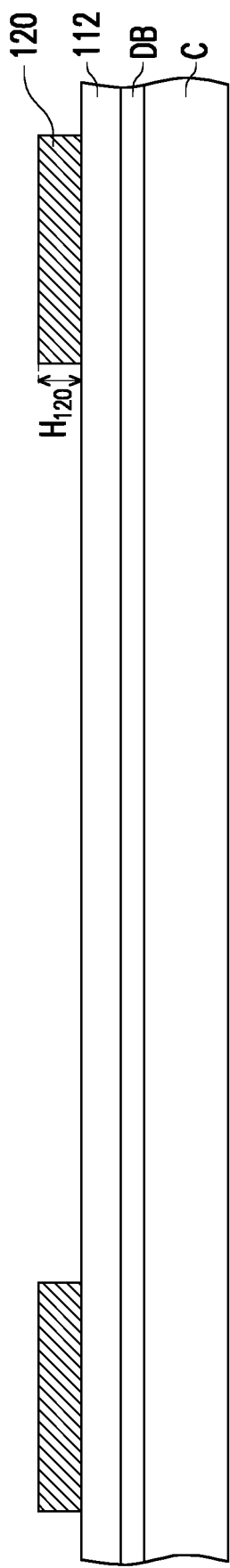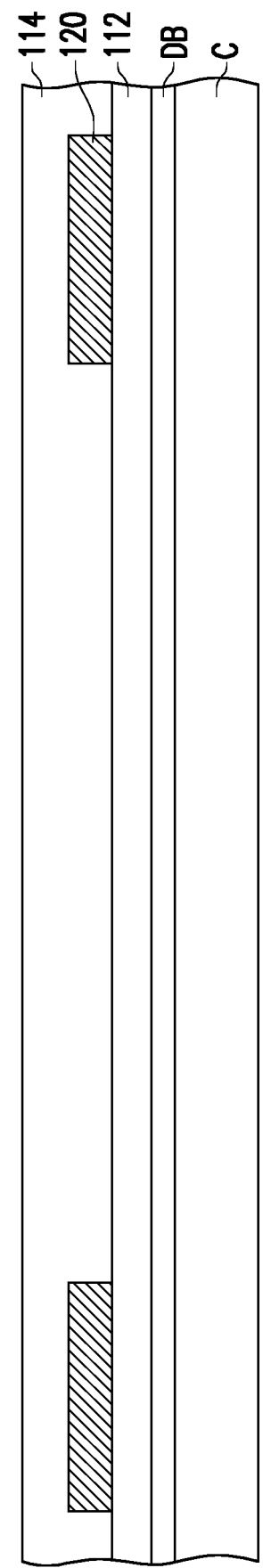

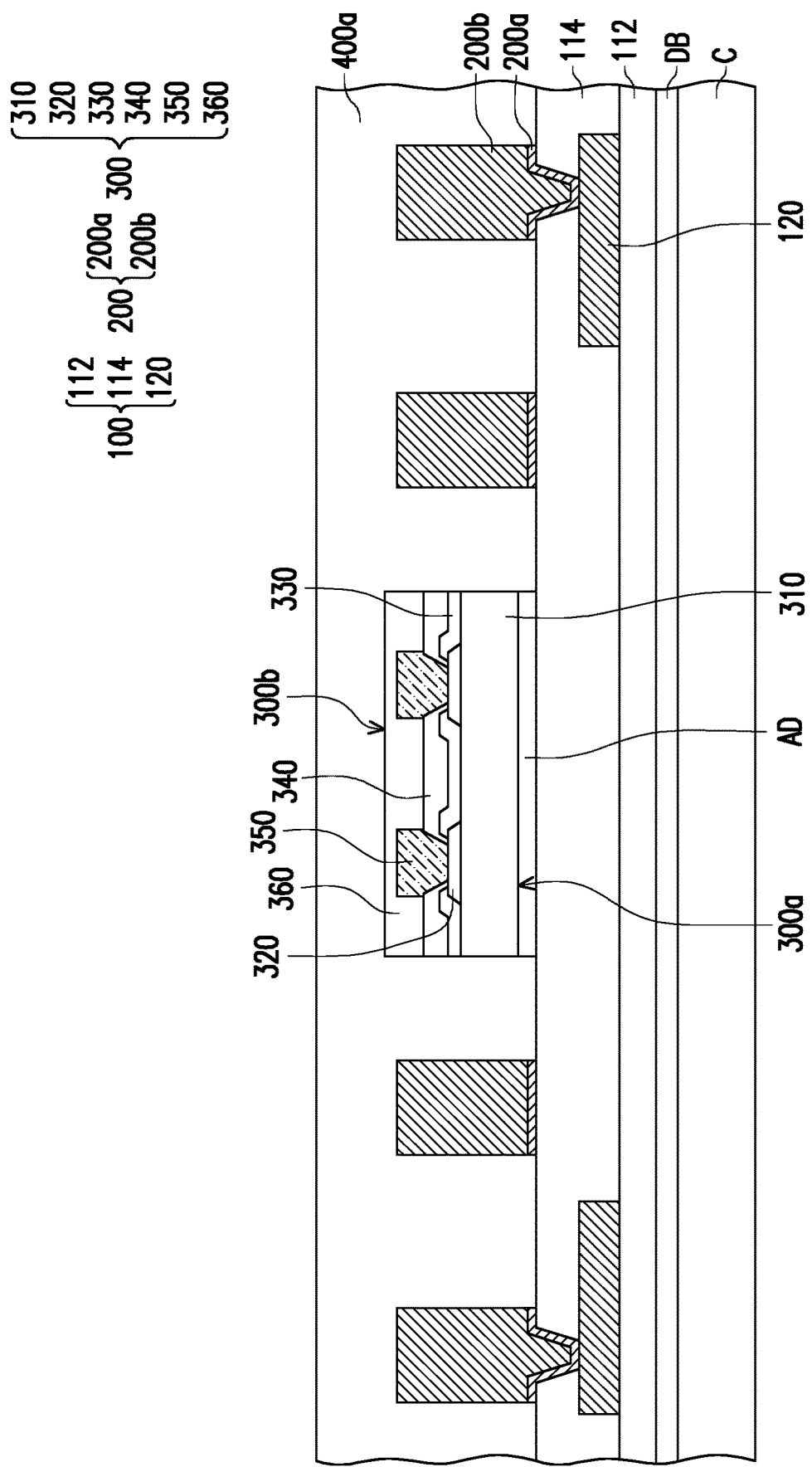

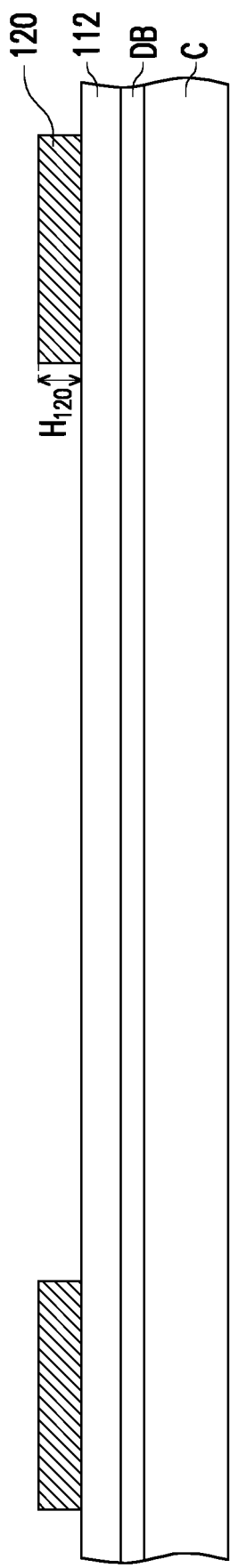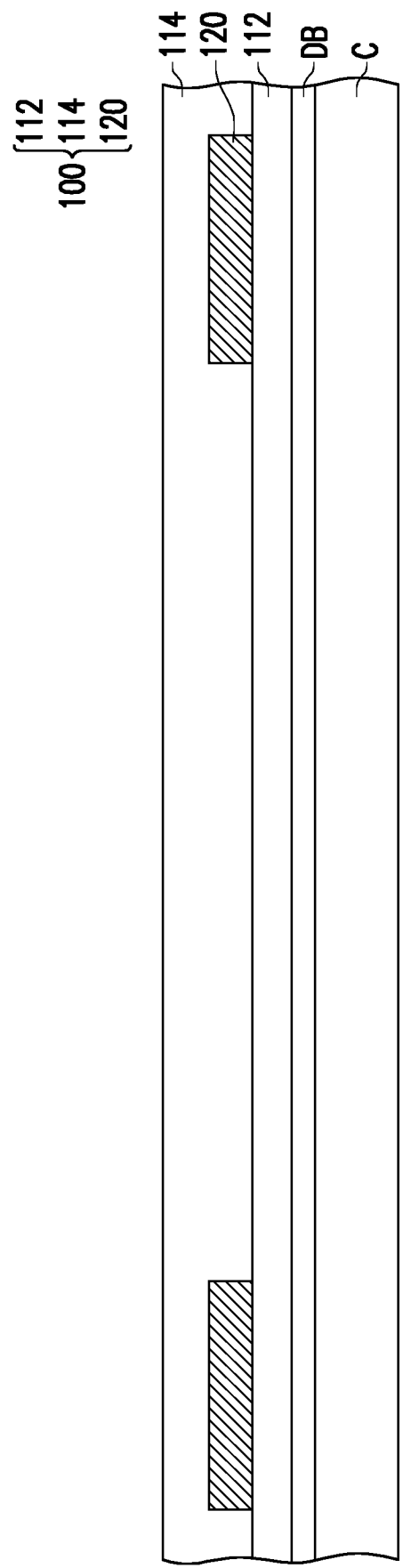
FIG. 3A
FIG. 3B

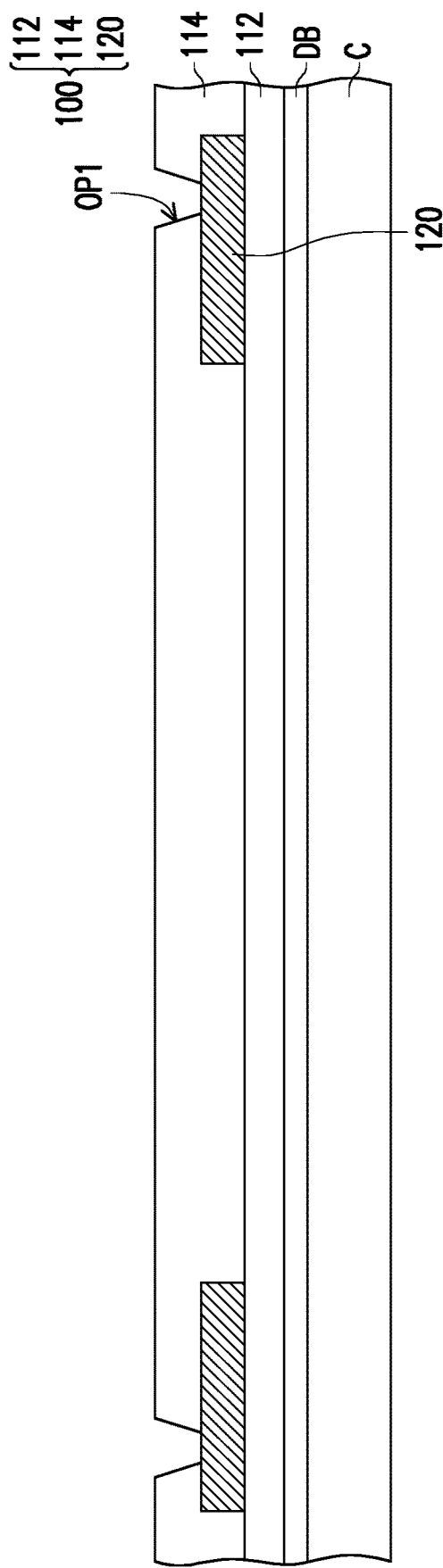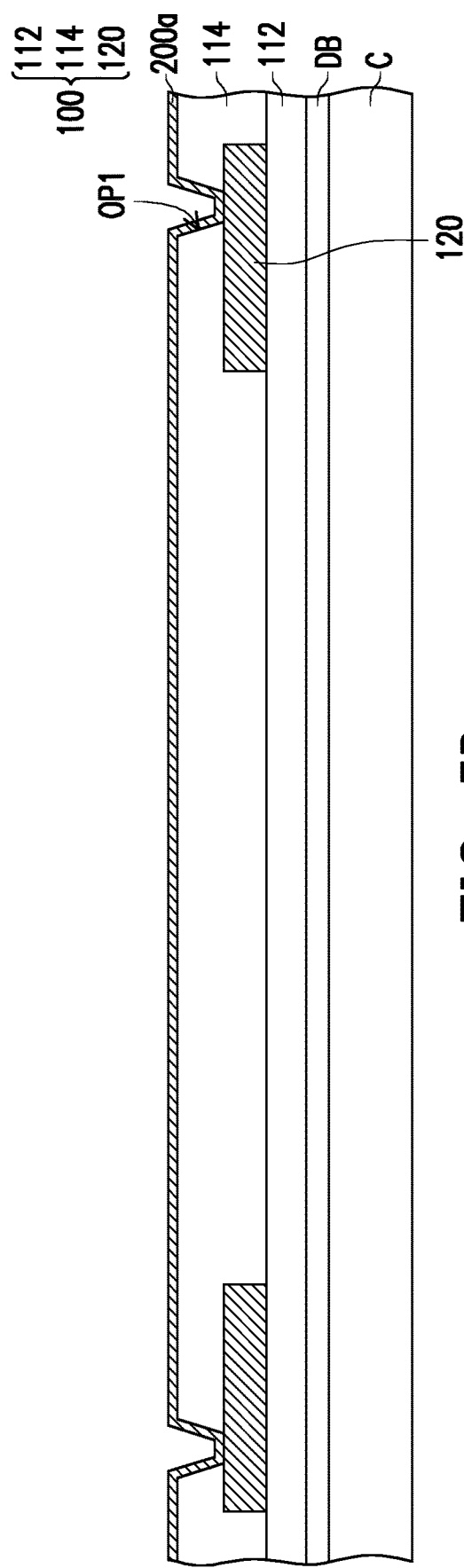

PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. For example, voltage regulators play significant roles in power managements of electronic devices. Integration of voltages regulators and wafer level packaging have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
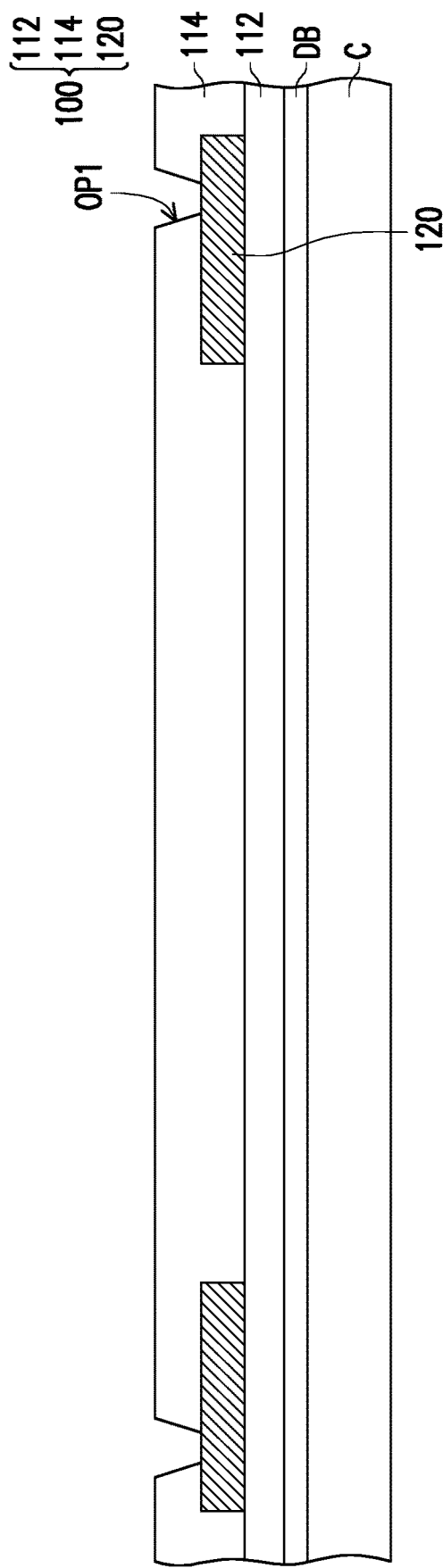
FIG. 1A to FIG. 1R are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1D:
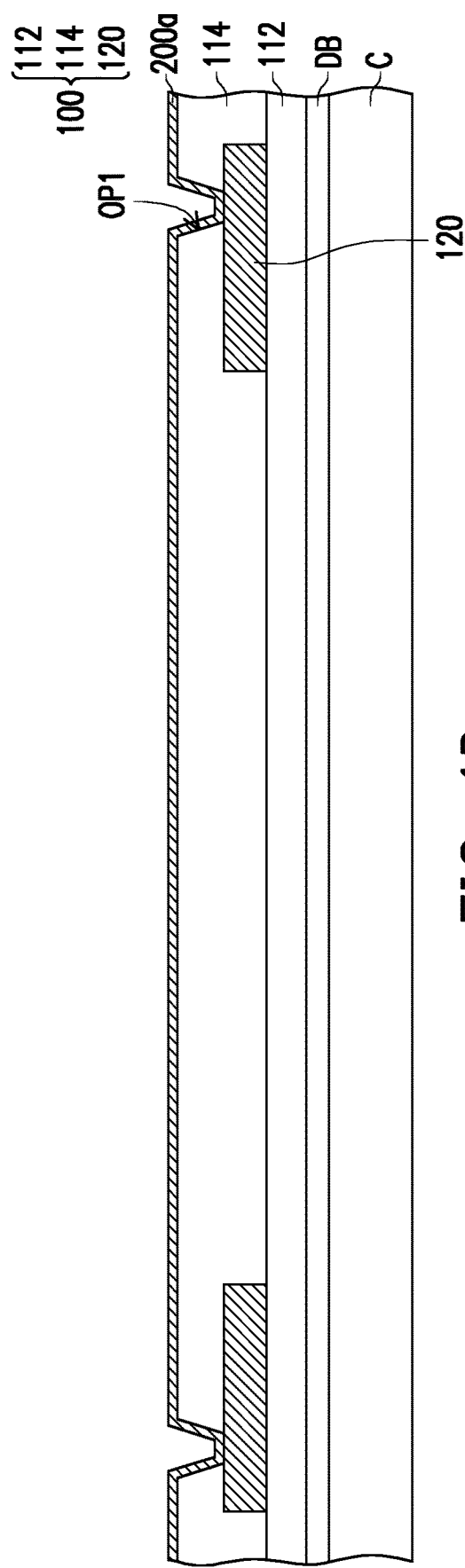
Figure 1E:
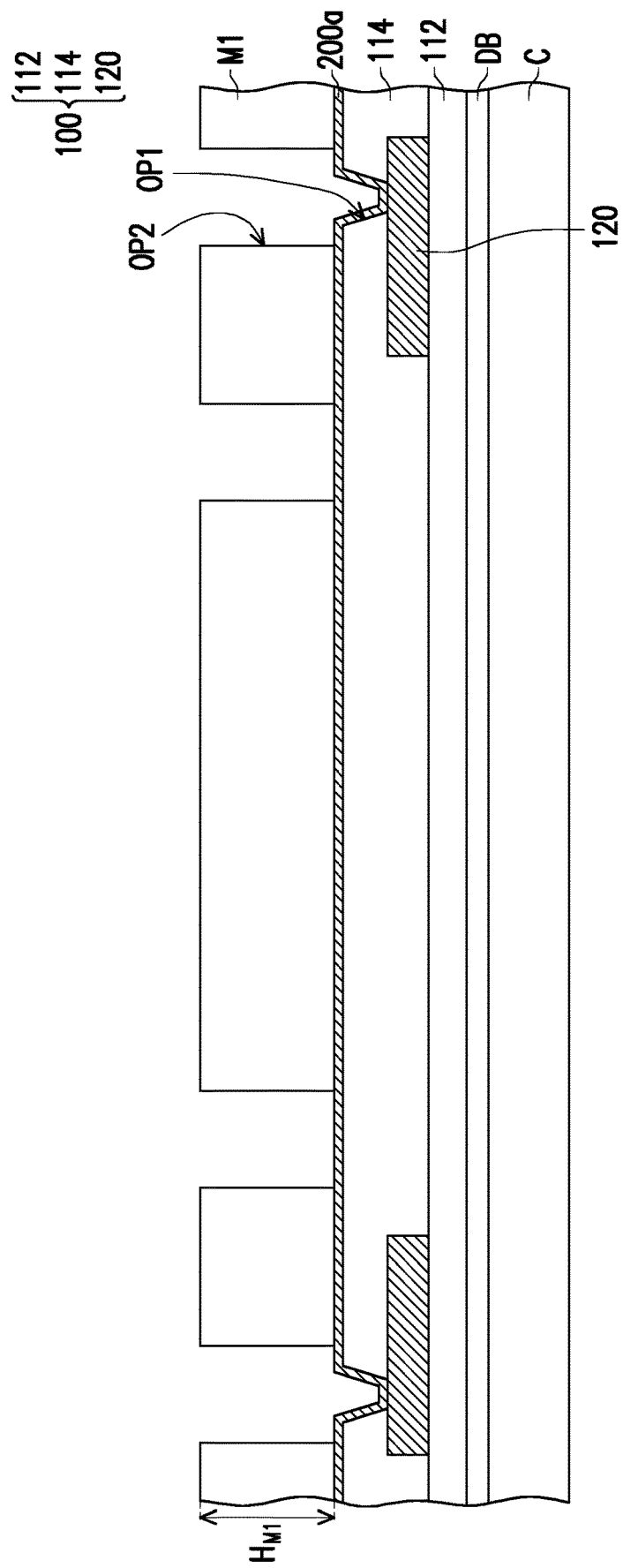
Figure 1F:
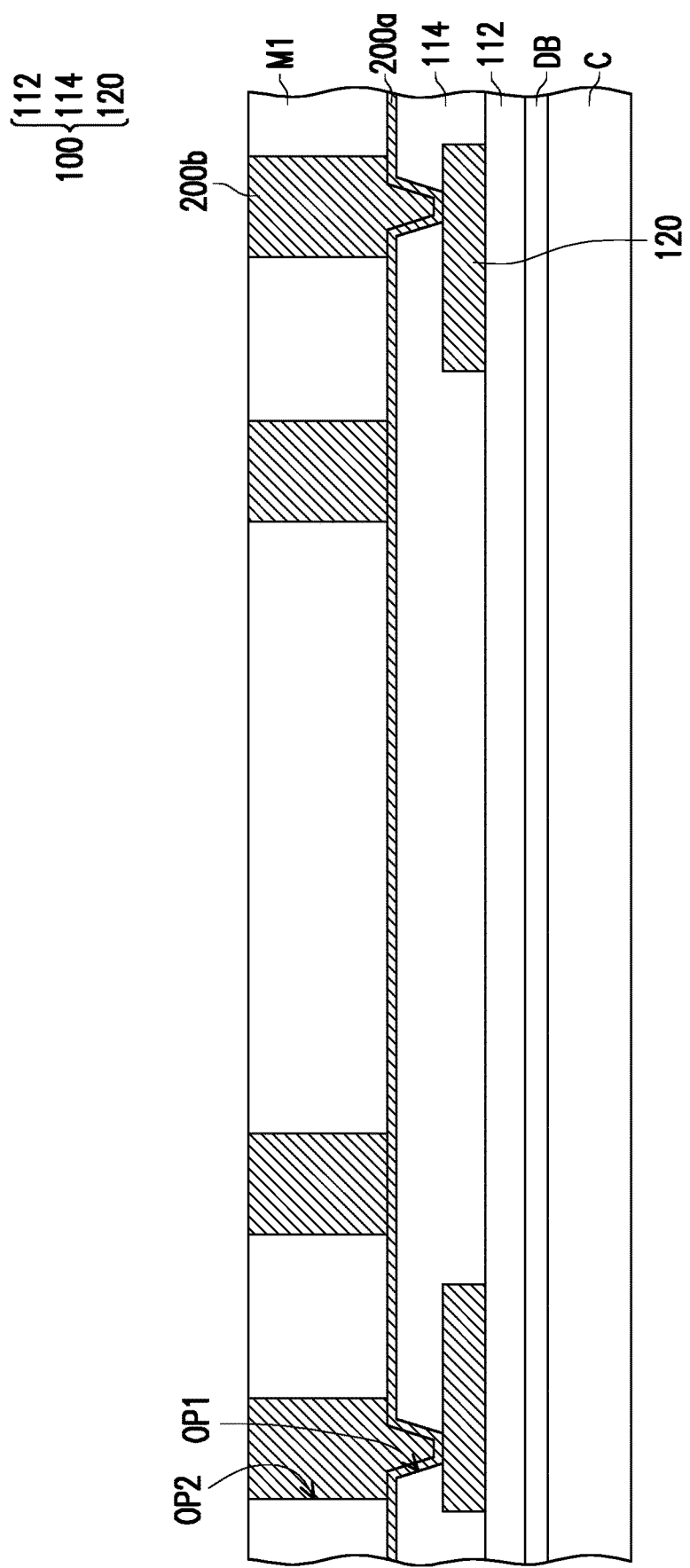
Figure 1G:
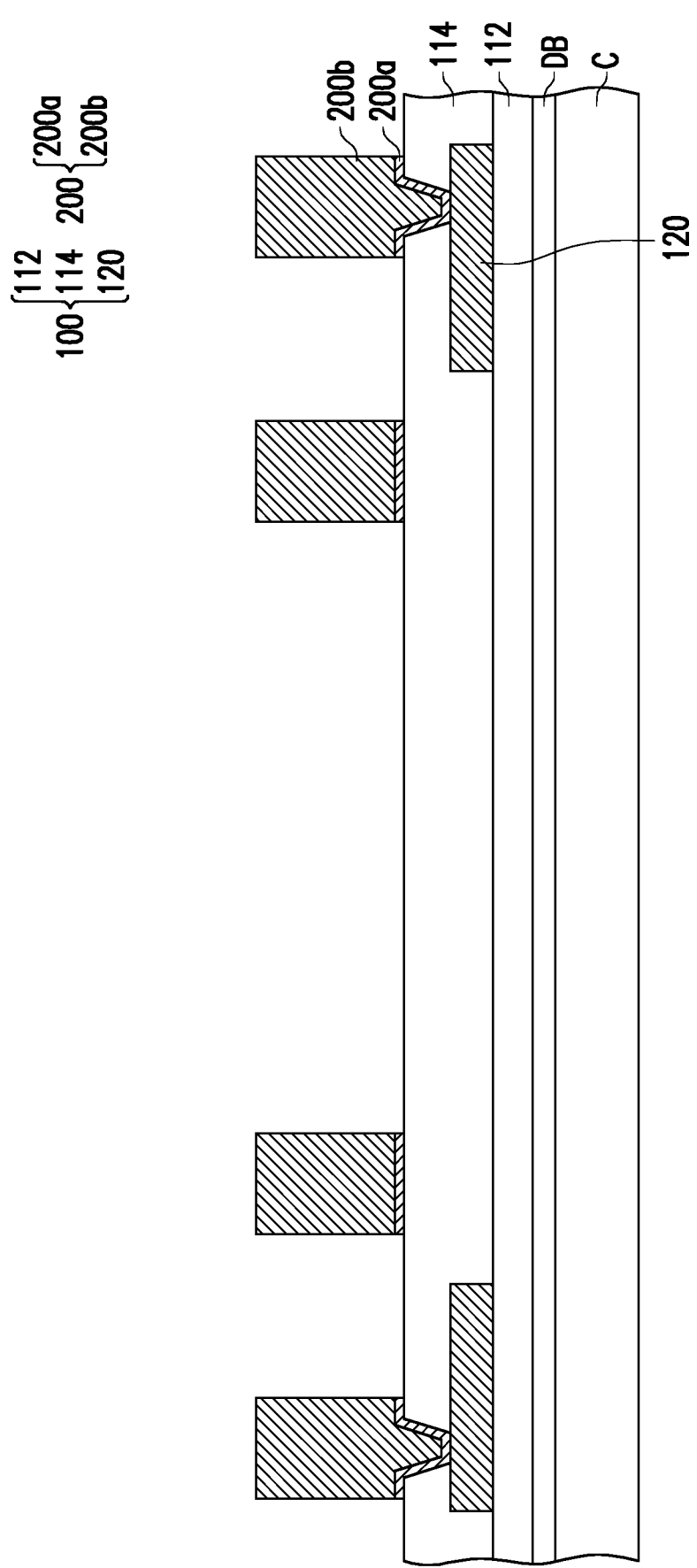
Figure 1H:
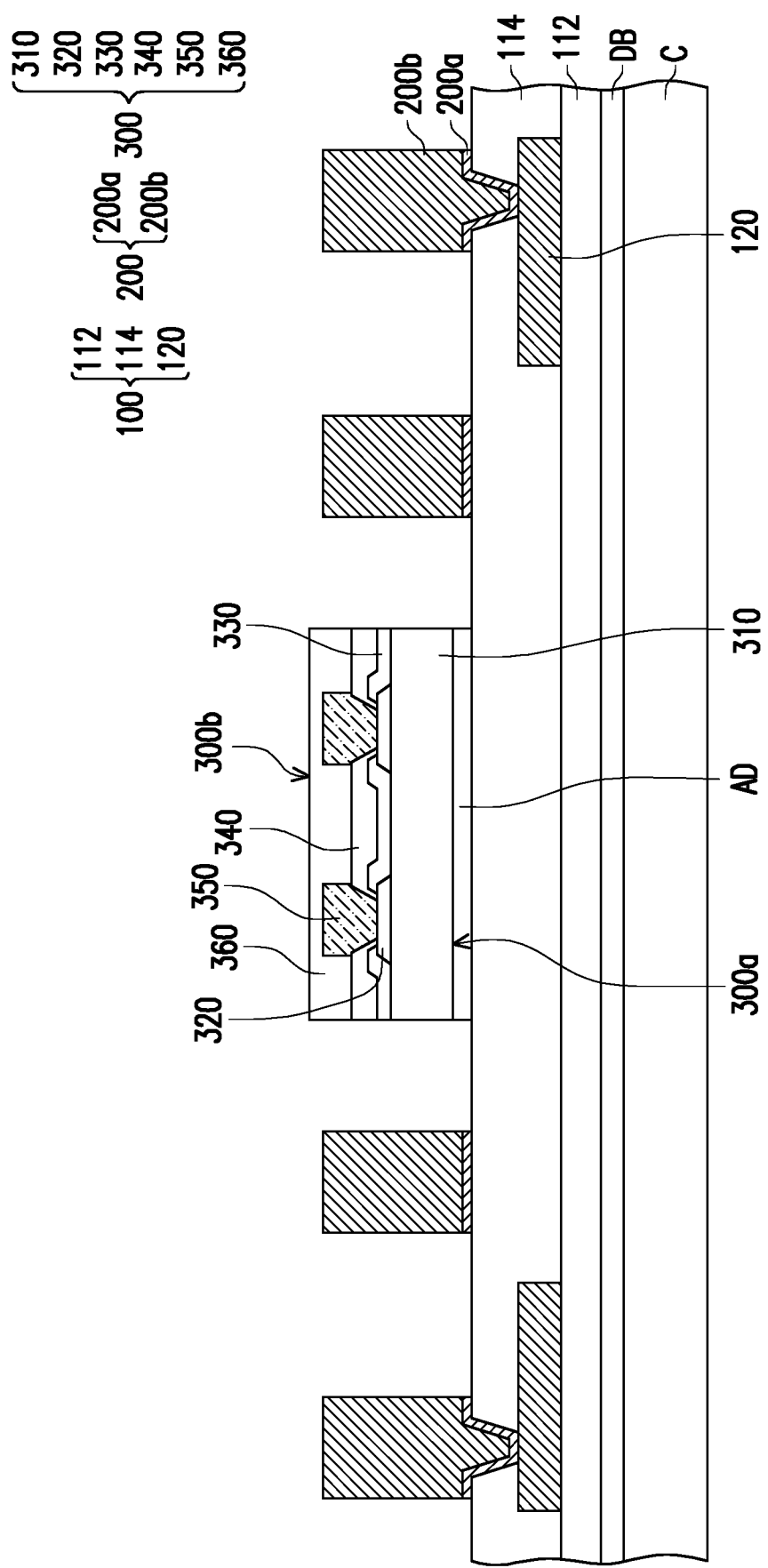
Figure 1J:
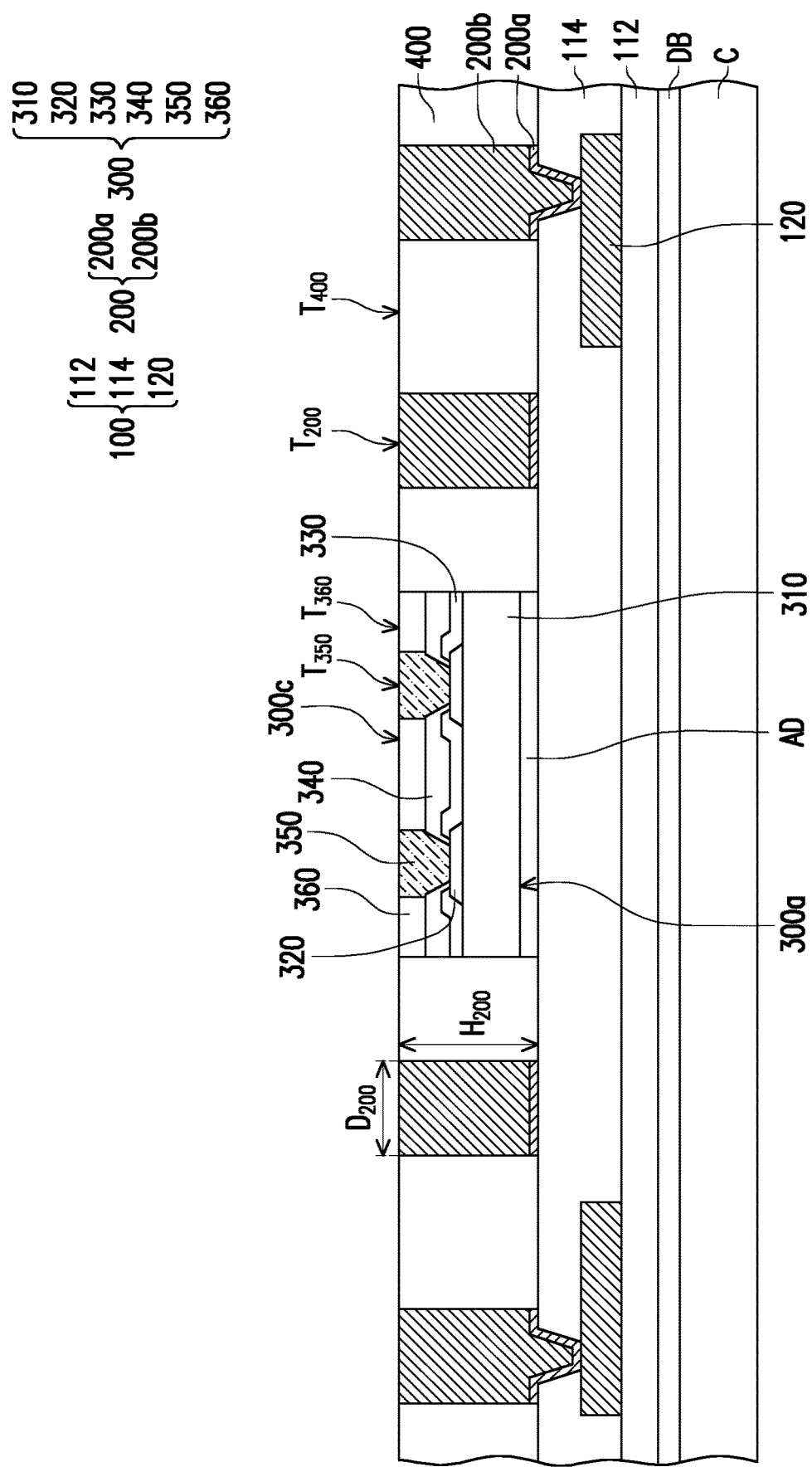
Figure 1K:
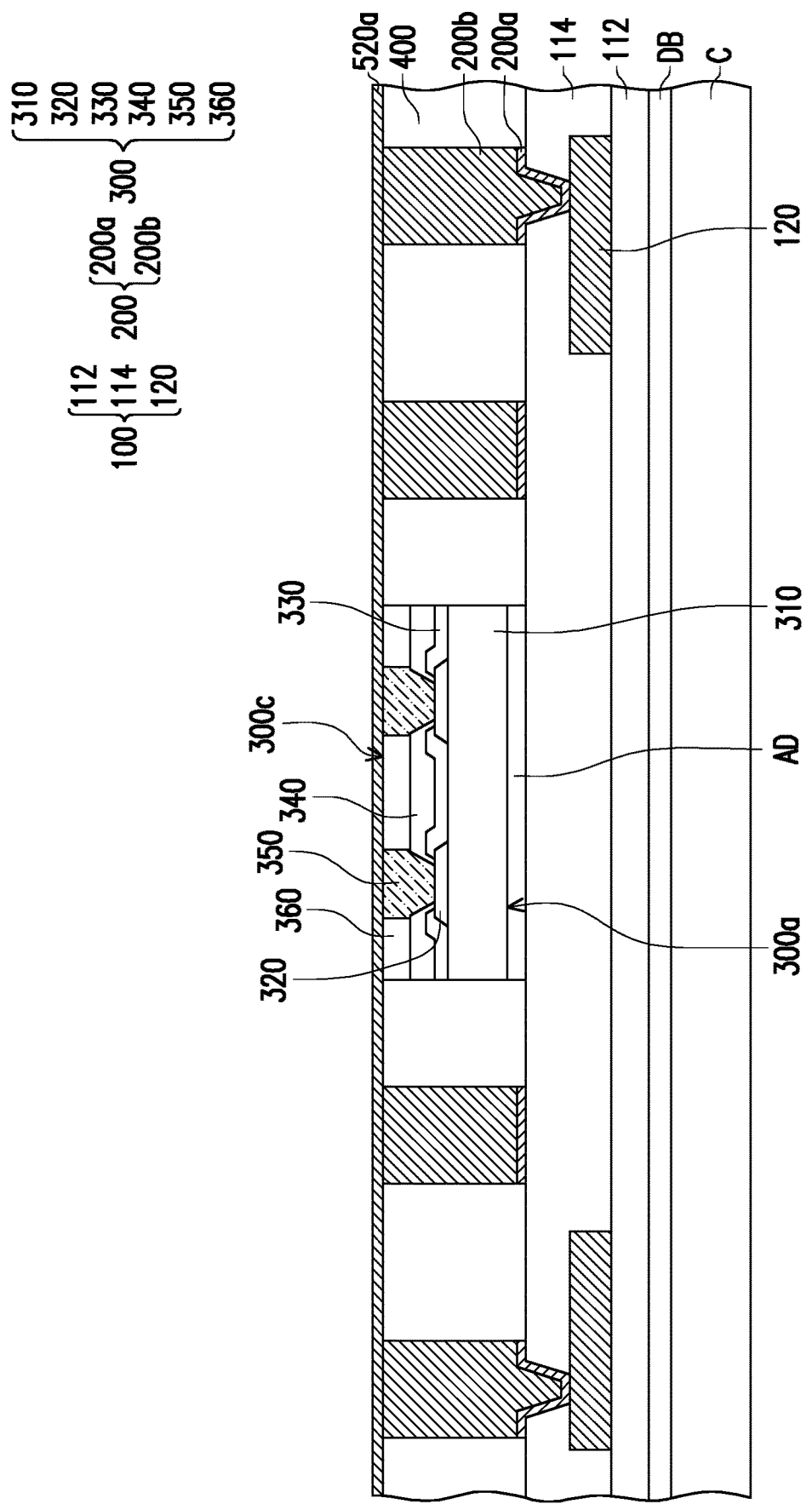
Figure 1L:
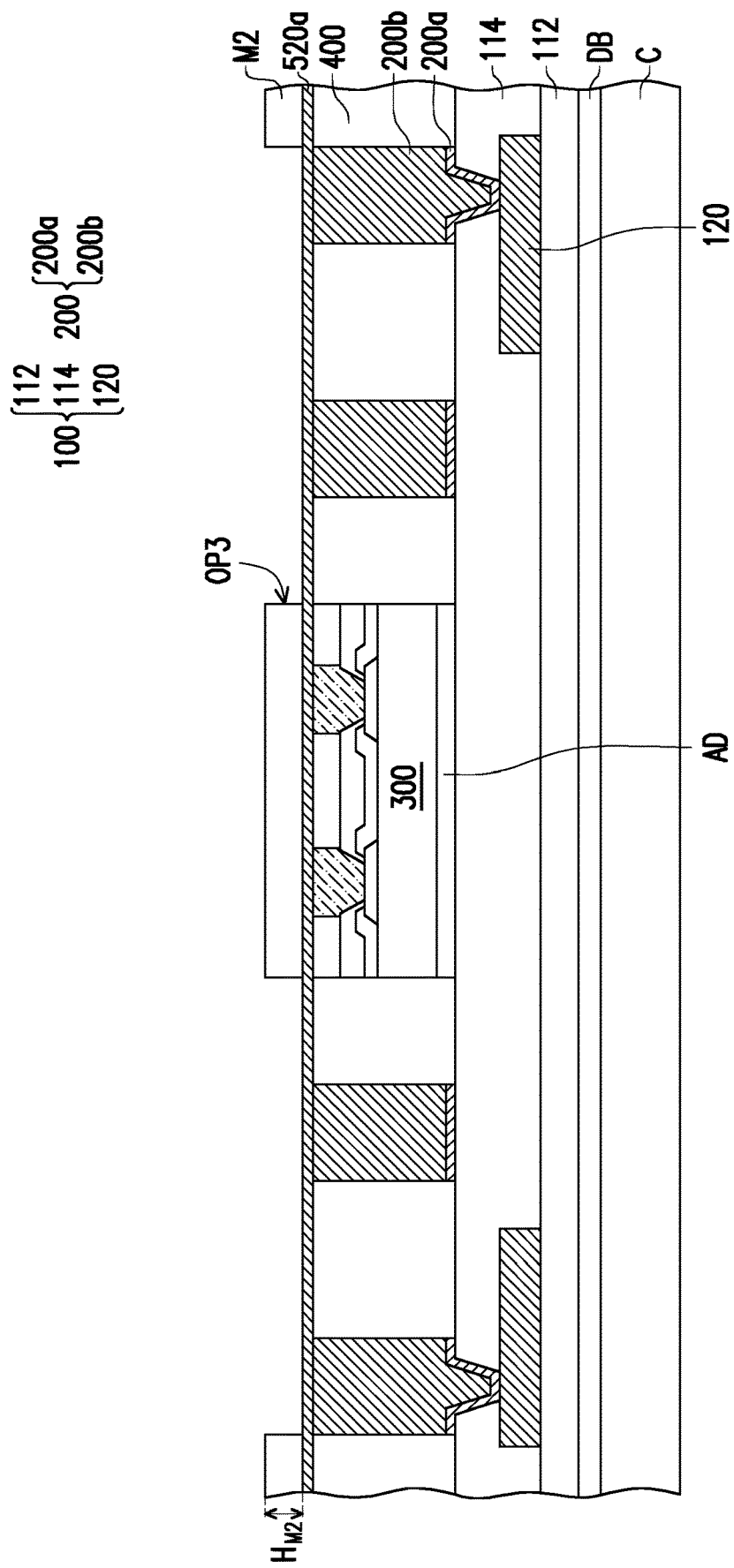
Figure 1M:
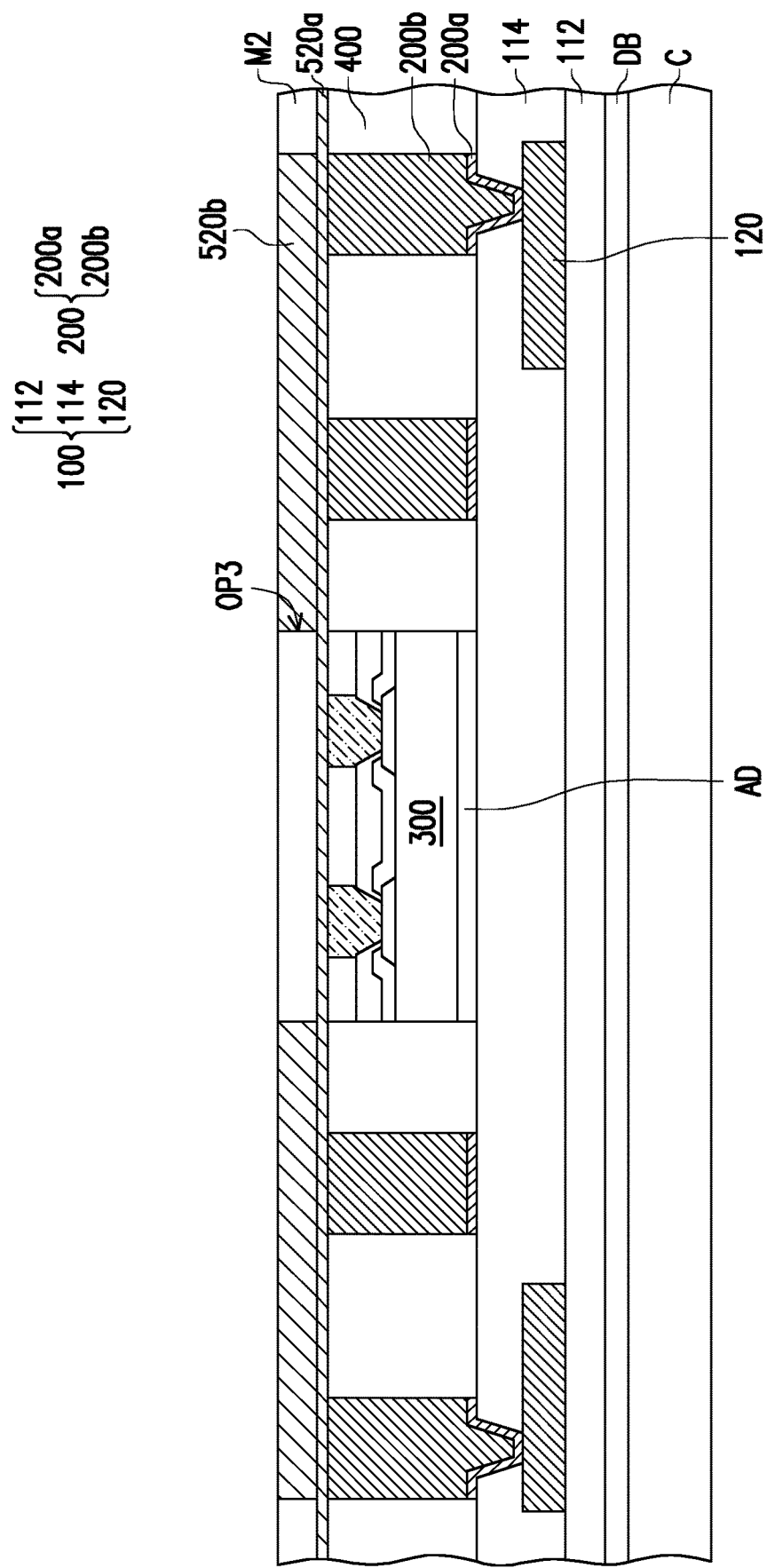
Figure 1N:
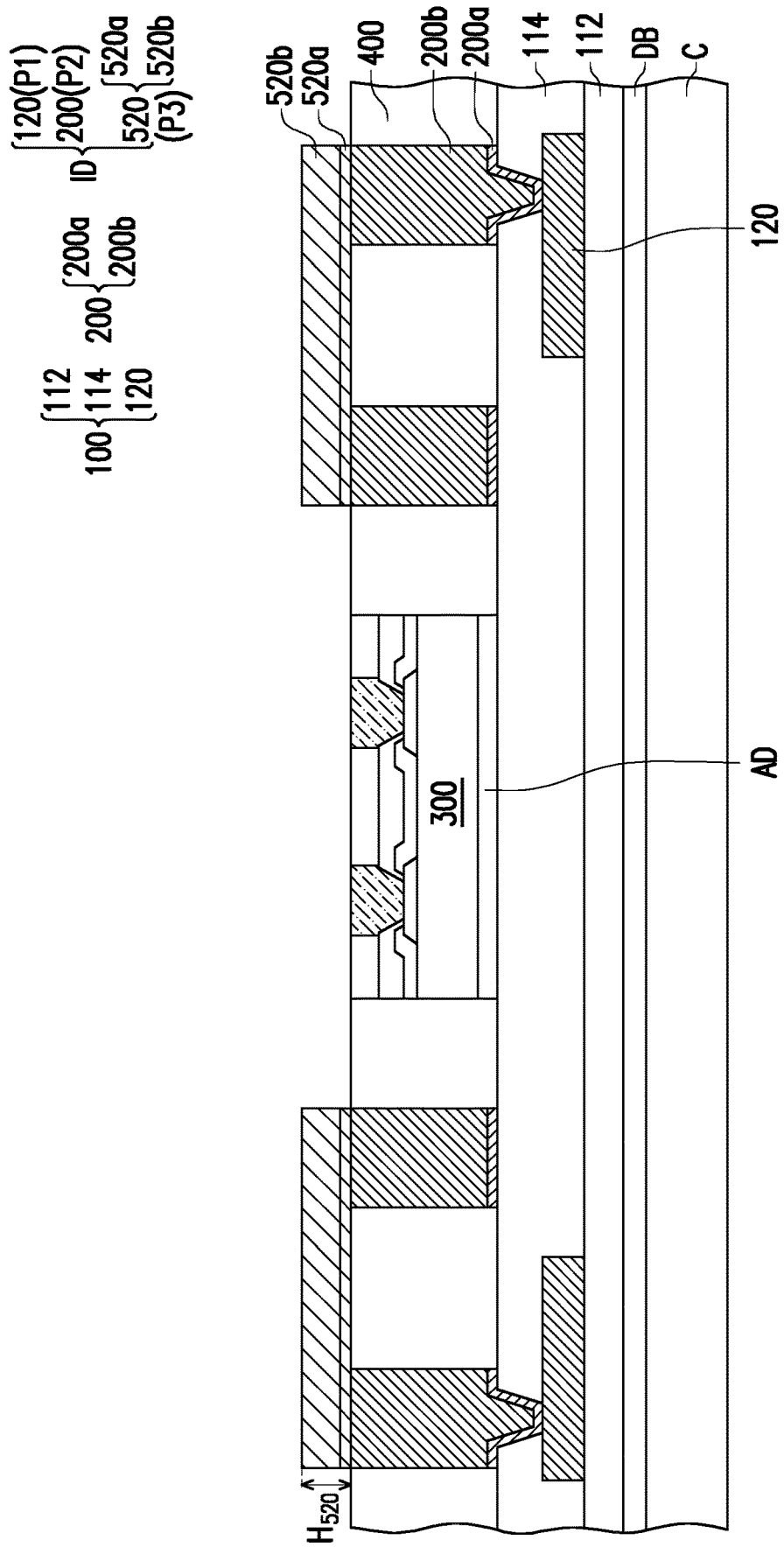
Figure 10:
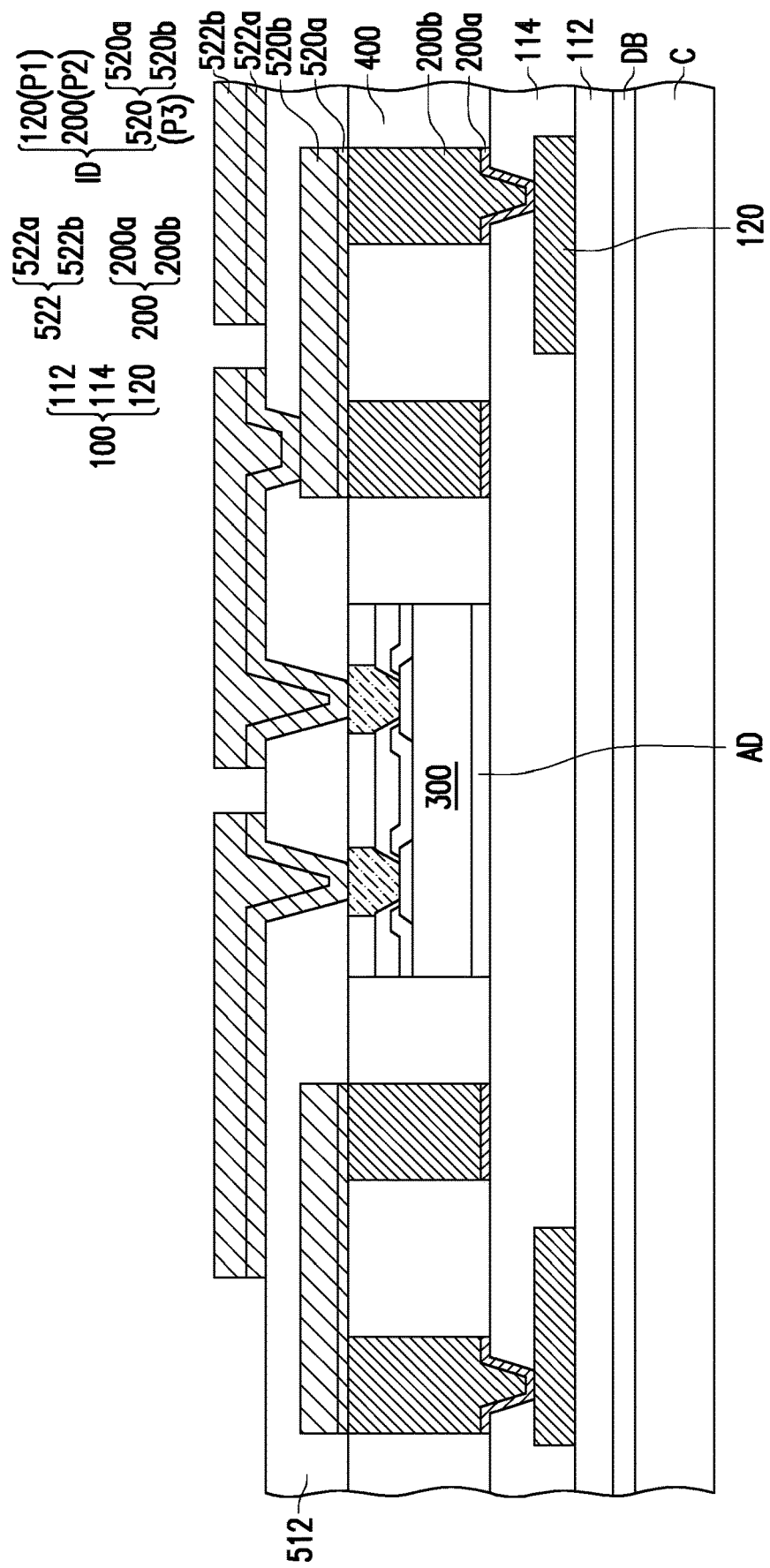
Figure 1P:
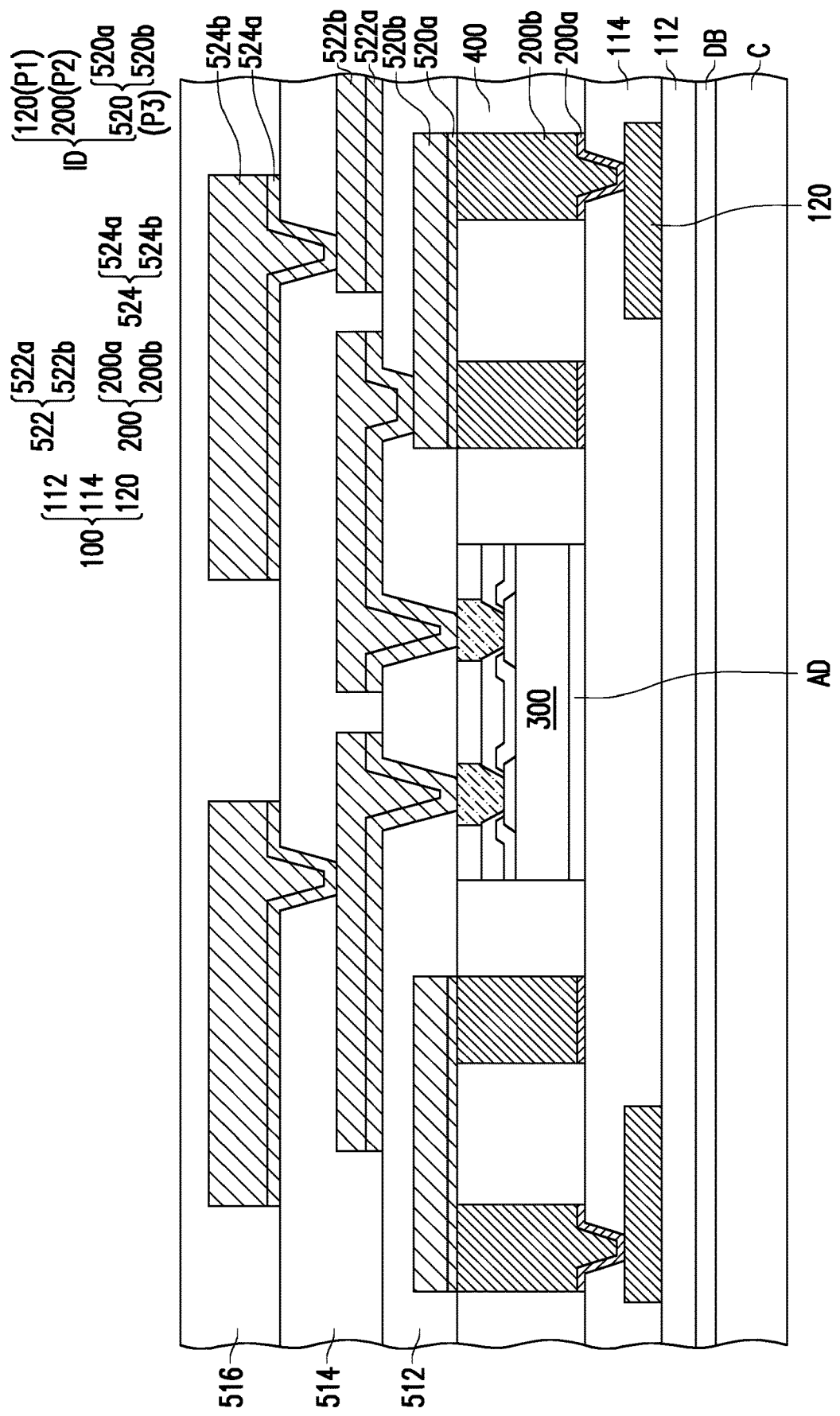
Figure 1Q:
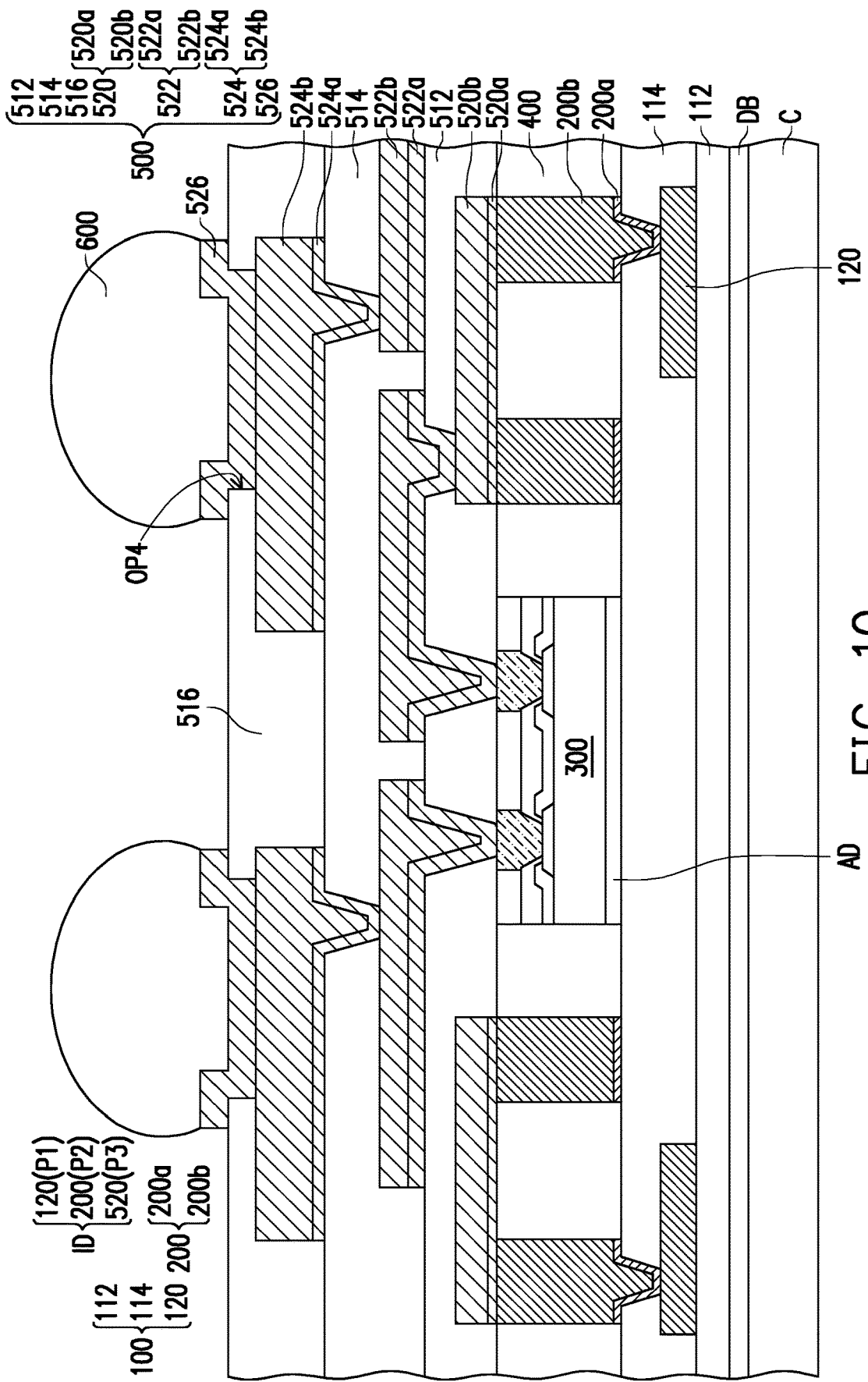
Figure 1R:
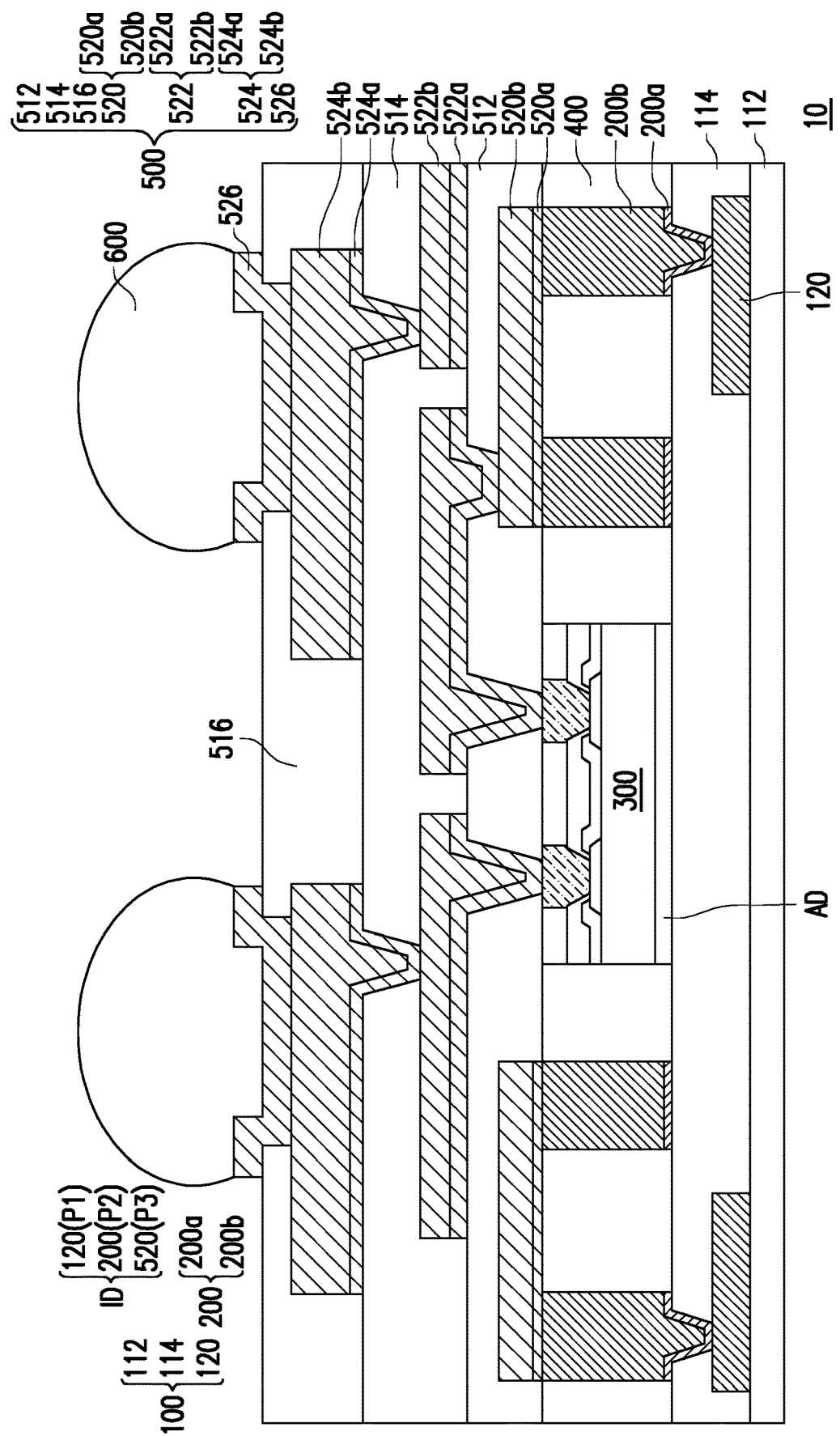

FIG. 1A to FIG. 1R are schematic cross-sectional views illustrating a manufacturing process of a package 10 in accordance with some embodiments of the disclosure. Referring to FIG. 1A, a carrier C having a de-bonding layer DB formed thereon is provided. In some embodiments, the de-bonding layer DB is formed on a top surface of the carrier C. In some embodiments, the carrier C may be a glass substrate and the de-bonding layer DB may be a light-to-heat conversion (LTHC) release layer formed on the glass substrate. However, the disclosure is not limited thereto. In some alternative embodiments, other suitable materials may be adapted for the carrier C and the de-bonding layer DB.

As illustrated in FIG. 1A, a dielectric layer 112 is formed on the de-bonding layer DB. In some embodiments, the dielectric layer 112 may be formed by suitable fabrication techniques such as spin-on coating, chemical vapor deposition (CVD), plasma-enhanced chemical vapor deposition (PECVD), or the like. In some embodiments, the dielectric layer 112 includes polymeric material. The polymeric material may include low temperature polyimide (LTPI), epoxy resin, acrylic resin, phenol resin, benzocyclobutene (BCB), polybenzooxazole (PBO), or any other suitable polymer-based dielectric material. In some embodiments, the polymeric material is dissolved in a solvent to enhance the coating fluidity. In some embodiments, after the polymeric material is uniformly coated on the de-bonding layer DB, a curing process is performed to evaporate the solvent. For example, the dielectric layer 112 may be cured through a soft baking process.

As illustrated in FIG. 1A, a plurality of conductive patterns 120 is formed on the dielectric layer 112. In some embodiments, a material of the conductive patterns 120 includes aluminum, titanium, copper, nickel, tungsten, and/or alloys thereof. The conductive patterns 120 may be formed by, for example, electroplating, deposition, and/or photolithography and etching. For example, the conductive patterns 120 may be formed by the following steps. First, a seed material layer (not shown) is blanketly formed over the dielectric layer 112. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed conductive patterns 120. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the conductive patterns 120. In some embodiments, each conductive layer 120 is formed to have a height $H_{120}$ of about 2 µm to about 20 µm and a width $W_{120}$ (shown in FIG. 2) of about 2 µm to about 20 µm. On the other hand, two adjacent conductive patterns 120 may have a spacing of about 2 µm to about 20 µm therebetween.

Referring to FIG. 1B, a dielectric layer 114 is formed on the dielectric layer 112 to cover the conductive patterns 120. In other words, the conductive patterns 120 are sandwiched between the dielectric layer 112 and the dielectric layer 114. In some embodiments, a material and a formation method of the dielectric layer 114 may be similar to that of the dielectric layer 112. However, the disclosure is not limited thereto. In some alternative embodiments, the material and the formation method of the dielectric layer 114 may be different from that of the dielectric layer 112. In some embodiments, the dielectric layer 114 may be formed by suitable fabrication techniques such as spin-on coating, CVD, PECVD, or the like. In some embodiments, the dielectric layer 114 includes polymeric material. The polymeric material may include LTPI, epoxy resin, acrylic resin, phenol resin, BCB, PBO, or any other suitable polymer-based dielectric material. In some embodiments, the polymeric material is dissolved in a solvent to enhance the coating fluidity. In some embodiments, after the polymeric material is uniformly coated on the dielectric layer 112 and the conductive patterns 120, a curing process is performed to evaporate the solvent. For example, the dielectric layer 114 may be cured through a soft baking process. In some embodiments, the dielectric layer 114 has a permittivity (Dk) of about 2.5 to about 3.1 and a dissipation factor (Df) of about 0.005 to about 0.01.

In some embodiments, the dielectric layer 112, the dielectric layer 114, and the conductive patterns 120 are collectively referred to as a first redistribution structure 100. In some embodiments, the first redistribution structure 100 may be referred to as a back-side redistribution structure. It should be noted that the number of the conductive patterns and the number of the dielectric layers illustrated in FIG. 1B are merely for illustrative purposes, and the disclosure is not limited thereto. In some alternative embodiments, more layers of conductive pattern and more layers of dielectric layer may be formed depending on the circuit design. When more layers of conductive pattern and more layers of dielectric layer are adapted, these conductive patterns and these dielectric layers are stacked alternately, and the conductive patterns may be interconnected with one another through a plurality of conductive vias (not shown).

Referring to FIG. 1C, a plurality of contact openings OP1 is formed in the dielectric layer 114 to expose at least a portion of each conductive pattern 120. In some embodiments, the contact openings OP1 may be formed by a photolithography process and an etching process.

Referring to FIG. 1D, a seed layer 200a is blanketly and conformally formed over the dielectric layer 114. In some embodiments, the seed layer 200a extends into the contact openings OP1 to be directly in contact with the conducive patterns 120. In some embodiments, the seed layer 200a is a composite layer formed by different materials. For example, the seed layer 200a may be constituted by two sub-layers (not shown). The first sub-slayer may include titanium, titanium nitride, tantalum, tantalum nitride, other suitable materials, or a combination thereof. On the other hand, the second sub-layer may include copper, copper alloys, or other suitable choice of materials. In some embodiments, the seed layer 220a is formed by physical vapor deposition (PVD), sputtering, or other applicable methods.

Referring to FIG. 1E, a mask pattern M1 is formed on the seed layer 200a. The mask pattern M1 has openings OP2 partially exposing the seed layer 200a. In some embodiments, the seed layer 200a located inside of the contact openings OP1 of the dielectric layer 114 is exposed. In some embodiments, the openings OP2 of the mask pattern M1 also exposes portions of the seed layer 200a in proximity of the contact openings OP1. In some embodiments, the mask pattern M1 may be formed by a photosensitive material. For example, the mask pattern M1 may be a photoresist or a dry film. In some embodiments, the mask pattern M1 is formed to have a height $H_{M1}$ of about 100 µm to about 300 µm.

Referring to FIG. 1F, a conductive material layer 200b is filled into the openings OP2 of the mask pattern M1. In some embodiments, the conductive material layer 200b is formed on the portion of the seed layer 200a exposed by the openings OP2 of the mask pattern M1. In some embodiments, since the conductive material layer 200b fills into the openings OP2 of the mask pattern M1, the conductive material layer 200b and the openings OP2 of the mask pattern M1 may have the same contour. In some embodiments, the conductive material layer 200b may be formed by a plating process followed by a grinding process. In some embodiments, the plating process is, for example, electroplating, electroless-plating, immersion plating, or the like. On the other hand, the grinding process includes, for example, a mechanical grinding process, a chemical mechanical polishing (CMP) process, or the like. However, the disclosure is not limited thereto. In some alternative embodiments, the grinding process may be omitted. The conductive material layer 200b include, for example, copper, copper alloys, or the like.

Referring to FIG. 1F and FIG. 1G, the mask pattern M1 is removed. In some embodiments, the mask pattern M1 may be removed through a stripping process, an etching process, and/or a cleaning process. For example, the mask pattern M1 may be removed through applying chemicals such as dimethylsufoxide (DMSO), water ($H_2O$), and tetramethyl ammonium hydroxide (TMAH). In some embodiments, the TMAH compounds are able to break the cross-linkage of molecules within the mask pattern M1. On the other hand, the DMSO compounds are able to dissolve the molecules within the mask pattern M1. Upon removal of the mask pattern M1, a portion of the seed layer 200a is exposed. Subsequently, the exposed portion of the seed layer 200a is removed through an etching process. In some embodiments, the etching process may include an anisotropic etching process such as dry etch or an isotropic etching process such as wet etch. In some embodiments, an etchant for wet etch includes a combination of hydrogen fluoride (HF), copper (Cu), and ammonia ($NH_3$), a combination of HF and TMAH, or the like.

In some embodiments, the conductive material layer 200b and the remaining seed layer 200a may be collectively referred to as through insulating vias (TIV) 200. In other words, the TIVs 200 are formed on the first redistribution structure 100. In some embodiments, the TIVs 200 are electrically connected to the first redistribution structure 100. It should be noted that the number of the TIVs 200 shown in FIG. 1G merely serves as an exemplary illustration, and the number of the TIVs 200 may be varied based on demand.

Referring to FIG. 1H, a plurality of dies 300 is formed on the first redistribution structure 100. For simplicity, one die 300 is shown in FIG. 1H. In some embodiments, the dies 300 are placed such that the TIVs 200 surround the dies 300. In some embodiments, the dies 300 are picked-and-placed on the first redistribution structure 100. Each of the dies 300, for example, includes a semiconductor substrate 310, a plurality of conductive pads 320, a passivation layer 330, a post-passivation layer 340, a plurality of vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxynitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed from the contact openings of the post-passivation layer 340. The post-passivation layer 340 may be a polyimide layer, a PBO layer, or a dielectric layer formed by other suitable polymers. In some embodiments, the post-passivation layer 340 may be optional. In addition, the vias 350 are formed on the conductive pads 320. In some embodiments, the vias 350 are made of conductive materials and are plated on the conductive pads 320. For example, a material of vias 350 may include copper, copper alloys, or the like. The protection layer 360 is formed on the post-passivation layer 340 to cover the vias 350.

As illustrated in FIG. 1H, the die 300 has a rear surface 300a and a front surface 300b opposite to the rear surface 300a. In some embodiments, the rear surface 300a of the die 300 is attached (or adhered) to the first redistribution structure 100 through an adhesive layer AD. In some embodiments, the adhesive layer AD may include a die attach film (DAF) or other materials having adhesion property. On the other hand, the front surface 300b of the die 300 faces upward. As illustrated in FIG. 1H, top surface (the front surface 300b) of the die 300 is located at a level height higher than the top surfaces of the TIVs 200. However, the disclosure is not limited thereto. In some alternative embodiments, the top surface (the front surface 300b) of the die 300 may be substantially coplanar with top surfaces of the TIVs 200 or may be located at a level height lower than the top surfaces of the TIVs 200.

Although FIG. 1G and FIG. 1H illustrated that the dies 300 are placed on the first redistribution structure 100 after the TIVs 200 are formed, the disclosure is not limited thereto. In some alternative embodiments, the dies 300 may be placed before the TIVs 200 are formed on the first redistribution structure 100.

Referring to FIG. 1I, an encapsulation material 400a is formed over the first redistribution structure 100 to encapsulate the TIVs 200 and the dies 300. For example, the TIVs 200 and the protection layer 360 of the dies 300 are encapsulated by the encapsulation material 400a. In other words, the TIVs 200 and the protection layer 360 of the dies 300 are not revealed and are well protected by the encapsulation material 400a. In some embodiments, the encapsulation material 400a is a molding compound, a molding underfill, a resin (such as epoxy), or the like. In some embodiments, the encapsulation material 400a may include fillers. In some embodiments, the encapsulation material 400a has a permittivity (Dk) of about 2.5 to about 3.6 and a dissipation factor (Df) of about 0.005 to about 0.02. In some embodiments, the encapsulation material 400a may be formed by a molding process. For example, the encapsulation material 400a may be formed by a compression molding process.

Referring to FIG. 1I and FIG. 1J, the encapsulation material 400a and the protection layer 360 of the dies 300 are grinded until top surfaces $T_{350}$ of the vias 350 and top surfaces $T_{200}$ of the TIVs 200 are exposed. After the encapsulation material 400a is grinded, an encapsulant 400 is formed over the first redistribution structure 100 to encapsulate the TIVs 200 and the dies 300. In some embodiments, the encapsulation material 400a is grinded by a mechanical grinding process and/or a CMP process. In some embodiments, during the grinding process of the encapsulation material 400a, the protection layer 360 is grinded to reveal the vias 350. In some embodiments, portions of the vias 350 and portions of the TIVs 200 are slightly grinded as well. After grinding, each die 300 has an active surface 300c and a rear surface 300a opposite to the active surface 300c. The exposed portion of the vias 350 is located on the active surfaces 300c of the dies 300. On the other hand, each TIV 200 has a height $H_{200}$ of about 100 μm to about 250 μm and a diameter/width of about 50 μm to about 150 μm. It should be noted that in some embodiments, the height of the portion of the TIV 200 embedded within the dielectric layer 114 may be negligible.

As illustrated in FIG. 1J, the encapsulant 400 encapsulates sidewalls of the dies 300. That is, the encapsulant 400 laterally encapsulates the dies 300. In some embodiments, the encapsulant 400 is penetrated through by the TIVs 200. In other words, the dies 300 and the TIVs 200 are embedded in the encapsulant 400. It is noted that the top surfaces $T_{200}$ of the TIVs 200, the top surface $T_{360}$ of the protection layer 360, and the top surfaces $T_{350}$ of the vias 350 are substantially coplanar with a top surface $T_{400}$ of the encapsulant 400.

Referring to FIG. 1K, a seed layer 520a is blanketly and conformally formed on the active surface 300c of the dies 300, the TIVs 200, and the encapsulant 400. For example, the seed layer 520a is directly in contact with the vias 350 of the dies 300 and the TIVs 200. In some embodiments, a material and a formation method of the seed layer 520a may be similar to that of the seed layer 220a, so the detailed descriptions thereof are omitted herein.

Referring to FIG. 1L, a mask pattern M2 is formed on the seed layer 520a. The mask pattern M2 has openings OP3 partially exposing the seed layer 520a. In some embodiments, the seed layer 520a located directly above the TIVs 200 is exposed. In some embodiments, the mask pattern M2 may be formed by a photosensitive material. For example, the mask pattern M2 may be a photoresist or a dry film. In some embodiments, the mask pattern M2 is formed to have a height $H_{M2}$ of about 2 μm to about 20 μm.

Referring to FIG. 1M, a conductive material layer 520b is filled into the openings OP3 of the mask pattern M2. In some embodiments, the conductive material layer 520b is formed on the portion of the seed layer 520a exposed by the openings OP3 of the mask pattern M2. In some embodiments, since the conductive material layer 520b fills into the openings OP3 of the mask pattern M2, the conductive material layer 520b and the openings OP3 of the mask pattern M2 may have the same contour. In some embodiments, the conductive material layer 520b may be formed by a plating process followed by a grinding process. In some embodiments, the plating process is, for example, electroplating, electroless-plating, immersion plating, or the like. On the other hand, the grinding process includes, for example, a mechanical grinding process, a CMP process, or the like. However, the disclosure is not limited thereto. In some alternative embodiments, the grinding process may be omitted. The conductive material layer 520b include, for example, copper, copper alloys, or the like.

Referring to FIG. 1M and FIG. 1N, the mask pattern M2 is removed. In some embodiments, the mask pattern M2 may be removed through a stripping process, an etching process, and/or a cleaning process. For example, the mask pattern M2 may be removed through applying chemicals such as dimethylsufoxide (DMSO), water ($H_2O$), and tetramethyl ammonium hydroxide (TMAH). In some embodiments, the TMAH compounds are able to break the cross-linkage of molecules within the mask pattern M2. On the other hand, the DMSO compounds are able to dissolve the molecules within the mask pattern M2. Upon removal of the mask pattern M2, a portion of the seed layer 520a is exposed. Subsequently, the exposed portion of the seed layer 520a is removed through an etching process. In some embodiments, the etching process may include an anisotropic etching process such as dry etch or an isotropic etching process such as wet etch. In some embodiments, an etchant for wet etch includes a combination of hydrogen fluoride (HF), copper (Cu), and ammonia ($NH_3$), a combination of HF and TMAH, or the like.

In some embodiments, the conductive material layer 520b and the remaining seed layer 520a may be collectively referred to as conductive patterns 520. In other words, the conductive patterns 520 are formed to be directly in contact with the TIVs 200 and the encapsulant 400. In some embodiments, each conductive layer 520 is formed to have a height $H_{520}$ of about 2 μm to about 20 μm and a width $W_{520}$ (shown in FIG. 2) of about 2 μm to about 20 μm. On the other hand, two adjacent conductive patterns 520 may have a spacing of about 2 μm to about 20 μm therebetween.

In some embodiments, at least a portion of the conductive patterns 120, at least a portion of the TIVs 200, and at least a portion of the conductive patterns 520 may be collectively referred to as an inductor ID. The configuration of the inductor ID will be discussed below in conjunction with FIG. 2.

Figure 2:
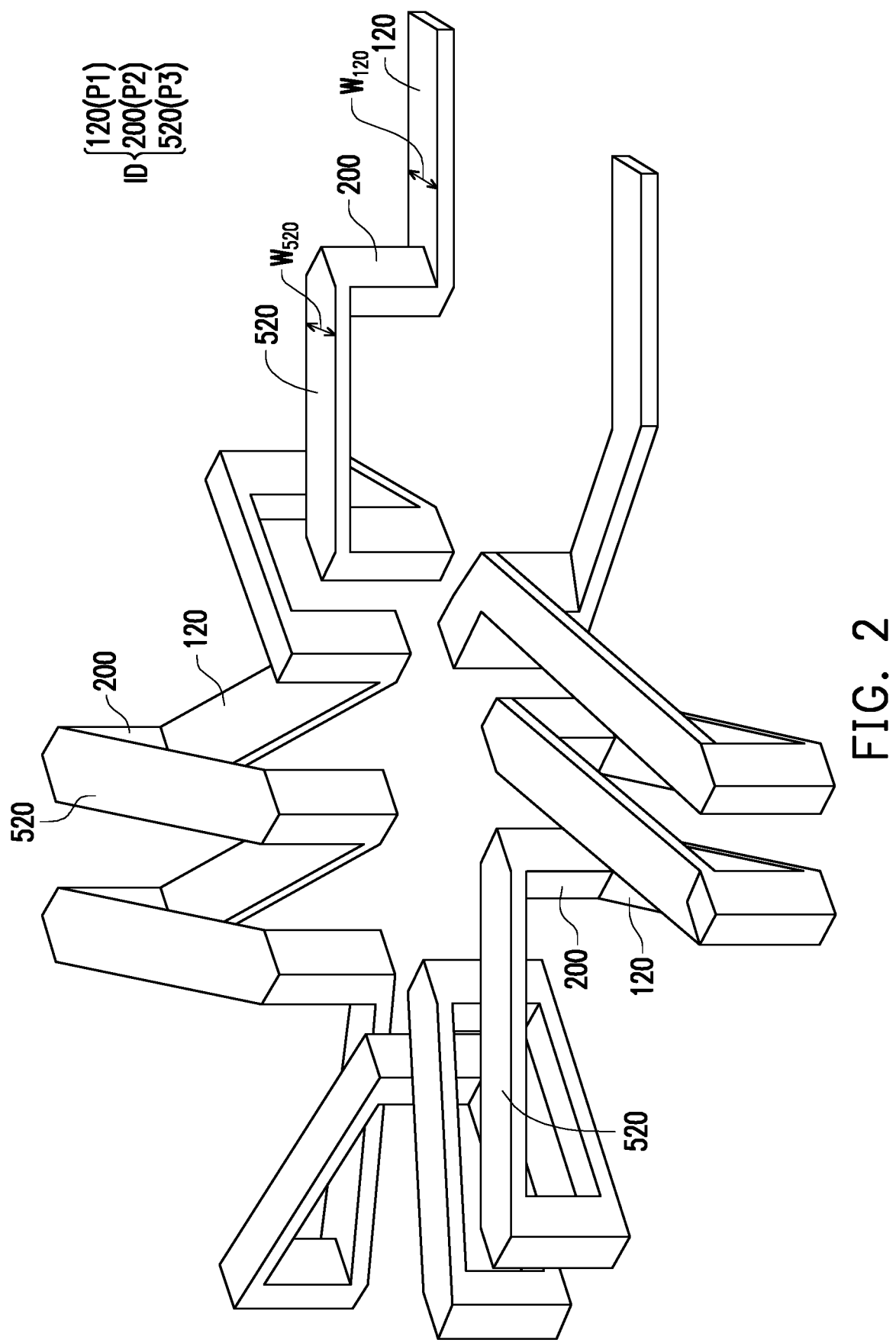
FIG. 2 is a schematic perspective view illustrating the inductor in FIG. 1N.

FIG. 2 is a schematic perspective view illustrating the inductor ID in FIG. 1N. Referring to FIG. 1N and FIG. 2, the inductor ID may be divided into a first portion P1, a second portion P2, and a third portion P3. The first portion P1, the second portion P2, and the third portion P3 are connected to each other. For example, the first portion P1 is connected to the second portion P2, and the second portion P2 is connected to the third portion P3. In some embodiments, at least a portion of the conductive patterns 120, at least a portion of the TIVs 200, and at least a portion of the conductive patterns 520 may respectively correspond to the first portion P1, the second portion P2, and the third portion P3. That is, at least a portion of the conductive patterns 120, at least a portion of the TIVs 200, and at least a portion of the conductive patterns 520 may be respectively referred to as the first portion P1, the second portion P2, and the third portion P3. As illustrated in FIG. 1N, the first portion P1 (the conductive patterns 120) is embedded in the first redistribution structure 100. Similarly, the second portion P2 (the TIVs 200) is embedded in the encapsulant 400. On the other hand, the third portion P3 (the conductive patterns 520) is embedded in the subsequently formed second redistribution structure 500 (shown in FIG. 1Q). In some embodiments, the dies 300 are surrounded by the inductor ID, which can reduce the area cost of the subsequently formed package 10 effectively. For example, the inductor ID surrounds the dies 300 to ensure the overall compactness of the package 10.

As illustrated in FIG. 2, the first portion P1 and the second portion P2 of the inductor ID are arranged in a staggered or an end-to-end manner such that the inductor ID forms a spiral or a coil embedded within the subsequently formed package 10. For example, one end of one of the conductive patterns 120 is vertically overlapped with one end of one of the conductive patterns 520 while another end of the one of the conductive patterns 120 is vertically overlapped with one end of another one of the conductive patterns 520. That is, two ends of one of the conductive patterns 120 are respectively connected to two adjacent conductive patterns 520 through two distinct TIVs 200. In some embodiments, the conductive patterns 120 (the first portion P1) are located on a same plane. Similarly, the conductive patterns 520 (the third portion P3) are also located on a same plane. Nevertheless, the first portion P1 and the third portion P3 are located on different planes and are connected by the second portion P2.

In some embodiments, the medium/core surrounded by the inductor ID is the encapsulant 400. In some embodiments, the encapsulant 400 has a magnetic permeability ($\mu_m$) of approximately 1. On the other hand, the inductor ID has a conductivity of about $1 \times 10^7$ siemens to about $5.96 \times 10^7$ siemens. As a result, in some embodiments, the inductor ID may have an inductance of about 1 nH to about 4.8 nH at a frequency of 1 MHz. In other words, the inductor ID may serve as a voltage regulator under high frequency to provide sufficient power management for high frequency applicable electronic devices. Meanwhile, as illustrated in FIG. 1N, since the inductor ID is integrated within the subsequently formed package 10, the compactness of the electronic device may be ensured. Furthermore, by utilizing the conductive patterns in the redistribution structures and the TIVs as portions of the inductor ID, the fabrication process of the inductor ID may be readily simplified, thereby rendering an effective and economical manufacturing process.

Referring to FIG. 1O, a dielectric layer 512 and a plurality of routing patterns 522 are sequentially formed on the conductive patterns 520. In some embodiments, the dielectric layer 512 is formed to cover the conductive patterns 520. In other words, the conductive patterns 520 are embedded within the dielectric layer 512. In some embodiments, a material and a formation method of the dielectric layer 512 may be similar to that of the dielectric layer 112 and the dielectric layer 114, so the detailed descriptions thereof are omitted herein.

As illustrated in FIG. 1O, the routing patterns 522 are formed on the dielectric layer 512. In some embodiments, each routing pattern 522 includes a seed layer 522a and a conductive material layer 522b stacked on the seed layer 522a. Materials and formation methods of the seed layer 522a and the conductive material layer 522b may be respectively similar to that of the seed layer 520a and the conductive material layer 520b, so the detailed descriptions thereof are omitted herein. In some embodiments, the routing patterns 522 are electrically connected to the vias 350 and the conductive patterns 520. In other words, the routing patterns 522 are electrically connected to the dies 300 and the inductor ID.

Referring to FIG. 1P, a dielectric layer 514, a plurality of routing patterns 524, and a dielectric layer 516 are sequentially formed on the routing patterns 522. In some embodiments, the dielectric layer 514 is formed to cover the routing patterns 522. In other words, the routing patterns 522 are sandwiched between the dielectric layer 512 and the dielectric layer 514. Similarly, the dielectric layer 516 is formed to cover the routing patterns 524. That is, the routing patterns 524 are sandwiched between the dielectric layer 514 and the dielectric layer 516. In some embodiments, materials and formation methods of the dielectric layer 514 and the dielectric layer 516 may be similar to that of the dielectric layer 512, so the detailed descriptions thereof are omitted herein.

As illustrated in FIG. 1P, the routing patterns 524 are formed on the dielectric layer 514. In some embodiments, each routing pattern 524 includes a seed layer 524a and a conductive material layer 524b stacked on the seed layer 524a. Materials and formation methods of the seed layer 524a and the conductive material layer 524b may be respectively similar to that of the seed layer 522a and the conductive material layer 522b, so the detailed descriptions thereof are omitted herein. In some embodiments, the routing patterns 524 are electrically connected to the routing patterns 522.

Referring to FIG. 1Q, a plurality of under-ball metallurgy (UBM) patterns 526 and a plurality of conductive terminals 600 are sequentially formed over the dielectric layer 516 and the routing patterns 524. In some embodiments, the dielectric layer 516 has a plurality of openings OP4 exposing the routing patterns 524. The UBM patterns 526 extends into the openings OP4 of the dielectric layer 516 to be directly in contact with the routing patterns 524. In other words, the UBM patterns 526 are electrically connected to the routing patterns 524. In some embodiments, a material and a formation method of the UBM patterns 526 may be similar to that of the routing patterns 522 and 524, so the detailed descriptions thereof are omitted herein.

In some embodiments, the conductive patterns 520, the dielectric layer 512, the routing patterns 522, the dielectric layer 514, the routing patterns 524, the dielectric layer 516, and the UBM patterns 526 are collectively referred to as a second redistribution structure 500. As mentioned above, the conductive patterns 520 may be referred to as the third portion P3 of the inductor ID. Therefore, the second redistribution structure 500 includes the third portion P3 of the inductor ID. In other words, the third portion P3 of the inductor ID may be considered as embedded in the bottom-most dielectric layer (the dielectric layer 512) of the second redistribution structure 500. As illustrated in FIG. 1Q, the second redistribution structure 500 is disposed over the TIVs 200, the dies 300, and the encapsulant 400. In other words, the encapsulant 400 is located between the first redistribution structure 100 and the second redistribution structure 500. In some embodiments, the second redistribution structure 500 may be referred to as a front-side redistribution structure. It should be noted that the number of the conductive patterns 520, the routing patterns 522, 524, the UBM patterns 526, and the dielectric layers 512, 514, 516 illustrated in FIG. 1Q are merely for illustrative purposes, and the disclosure is not limited thereto. In some alternative embodiments, more layers of routing pattern and more layers of dielectric layer may be formed depending on the circuit design. When more layers of routing pattern and more layers of dielectric layers are adapted, these routing patterns and these dielectric layers are stacked alternately, and the routing patterns may be interconnected with one another.

As illustrated in FIG. 1Q, the conductive terminals 600 are disposed on the UBM patterns 526. In some embodiments, the conductive terminals 600 are attached to the UBM patterns 526 through a solder flux. In some embodiments, the conductive terminals 600 are, for example, solder balls. In some embodiments, the conductive terminals 600 may be disposed on the second redistribution structure 500 through a ball placement process and/or a reflowing process.

Referring to FIG. 1R, after the conductive terminals 600 are mounted on the second redistribution structure 500, the de-bonding layer DB and the carrier C are removed from the first redistribution structure 100. In some embodiments, the de-bonding layer DB (e.g., the LTHC release layer) may be irradiated by an UV laser such that the carrier C and the de-bonding layer DB may be peeled off from the dielectric layer 112. Nevertheless, the de-bonding process is not limited thereto. Other suitable de-carrier methods may be used in some alternative embodiments. Thereafter, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the package 10 may be referred to as an integrated fan-out (InFO) package. However, the disclosure is not limited thereto. In some alternative embodiments, the package 10 may be other types of packages.

Figure 3E:
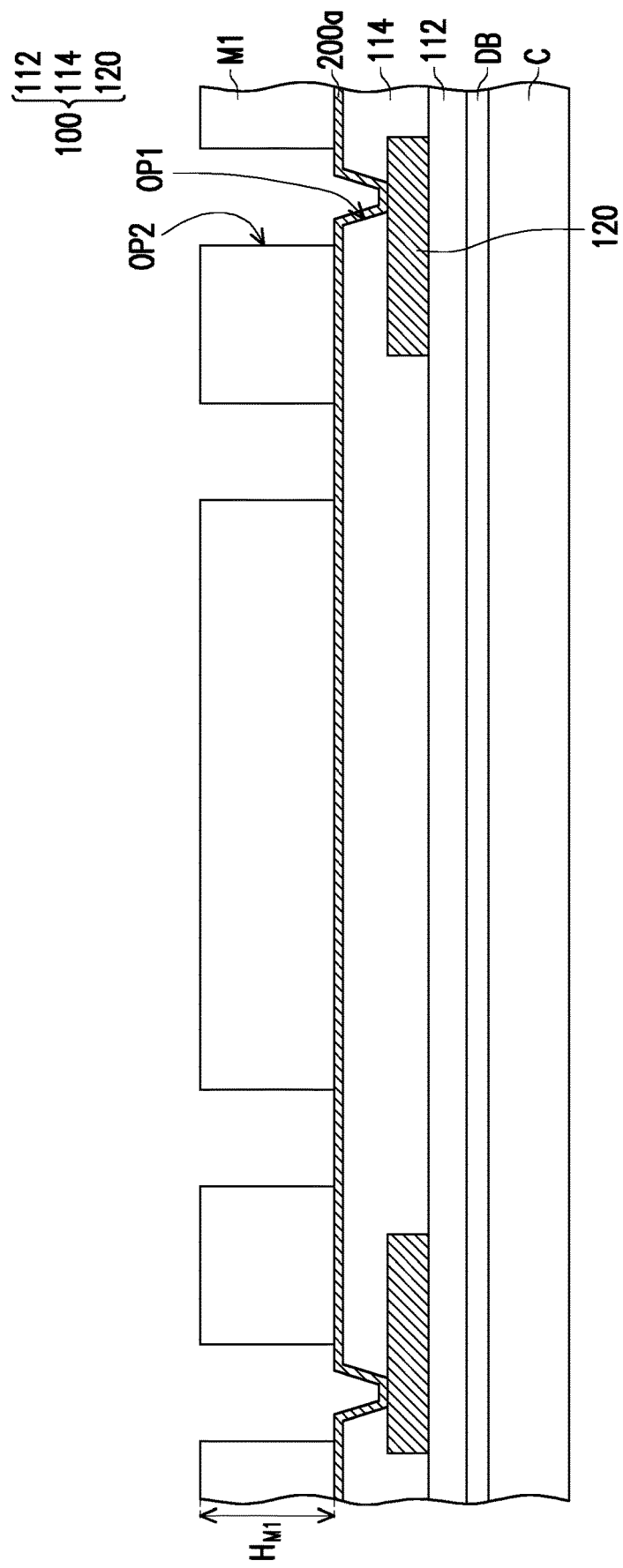
FIG. 3A to FIG. 3R are schematic cross-sectional views illustrating a manufacturing process of a package in accordance with some alternative embodiments of the disclosure.
Figure 3F:
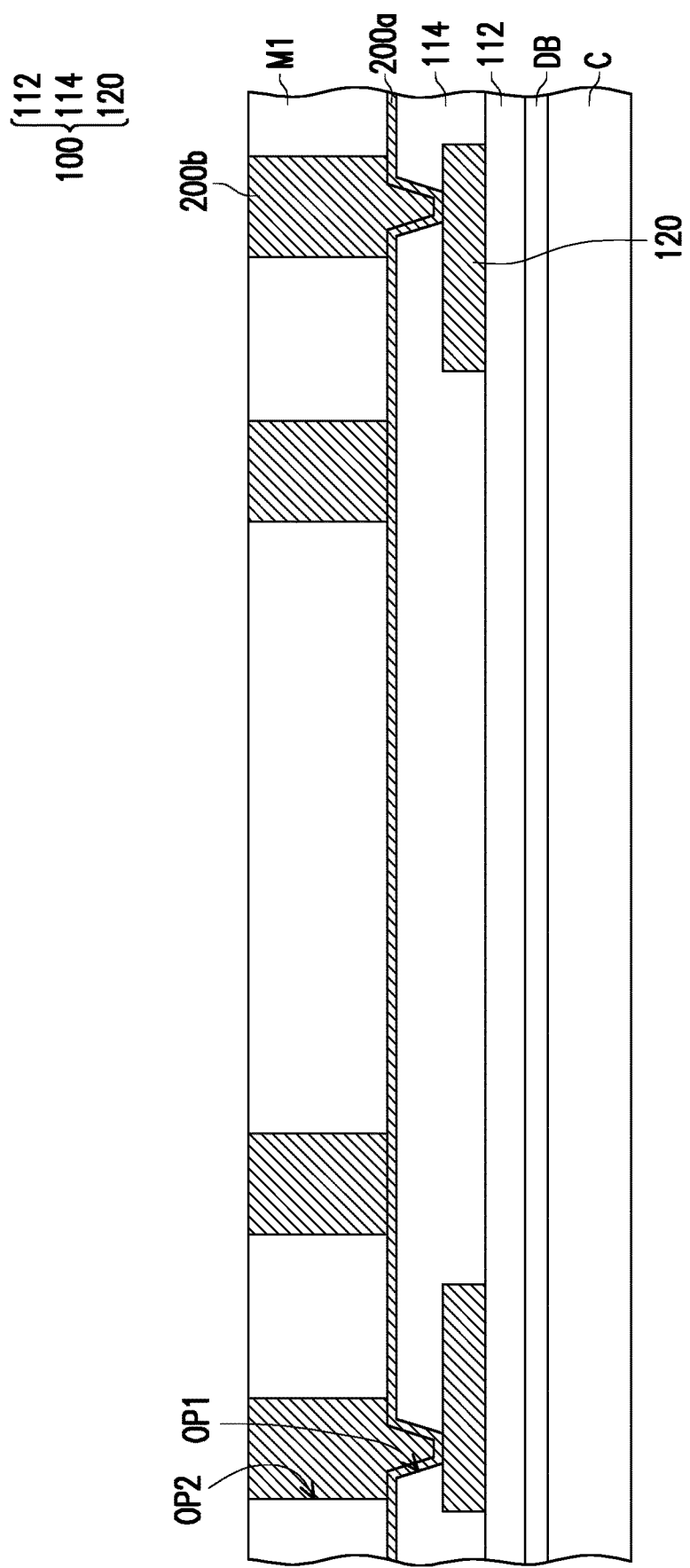
Figure 3G:
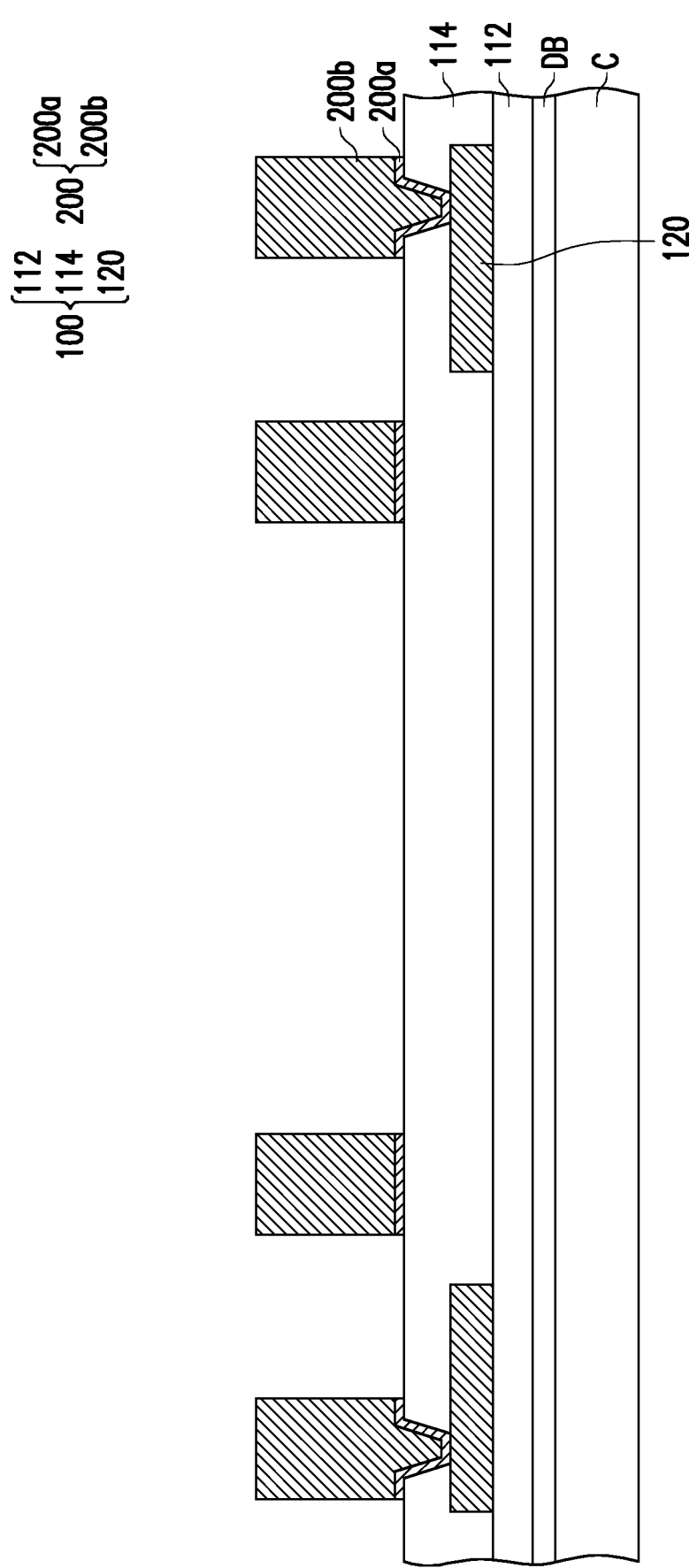
Figure 3H:
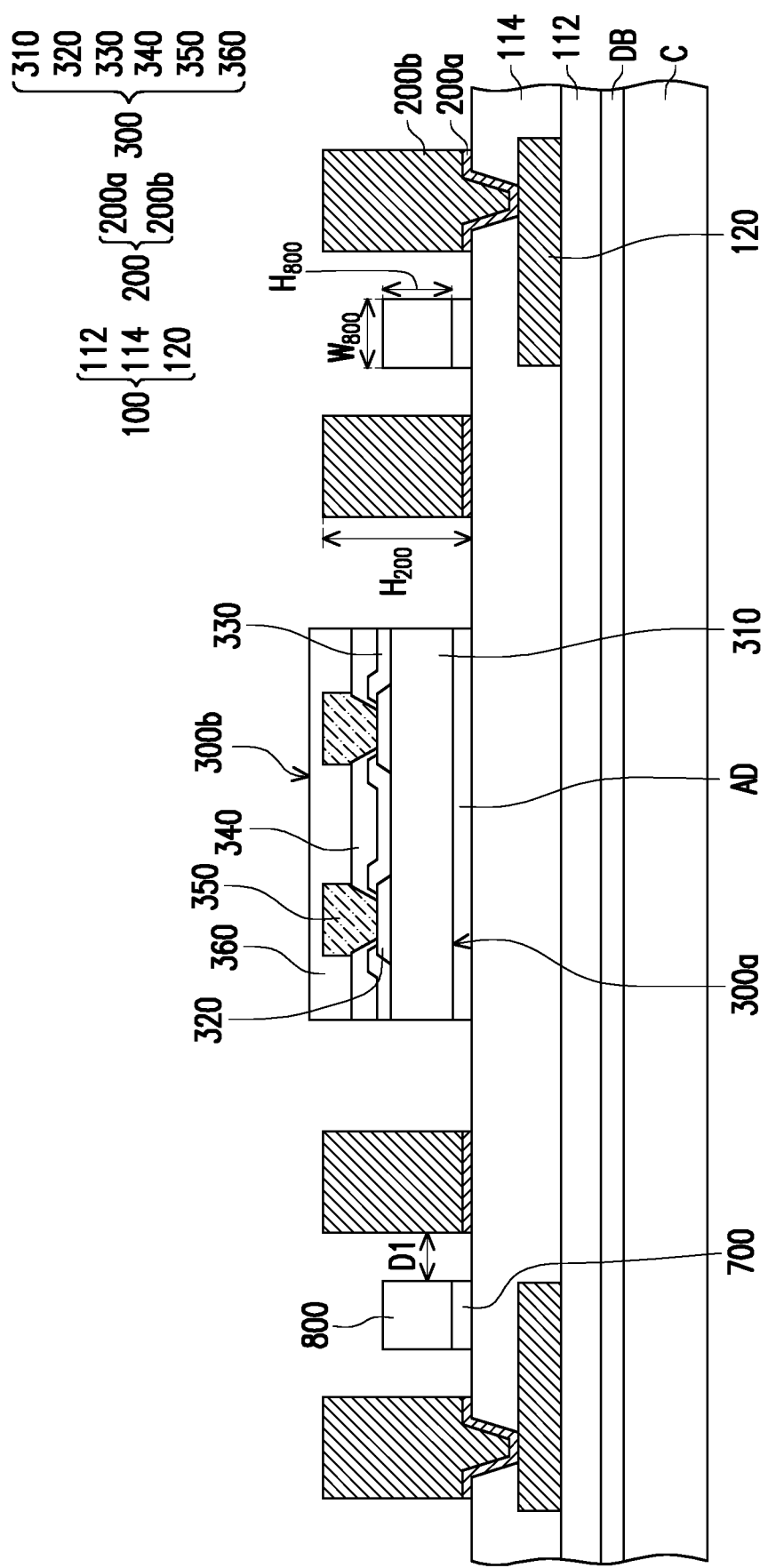
Figure 31:
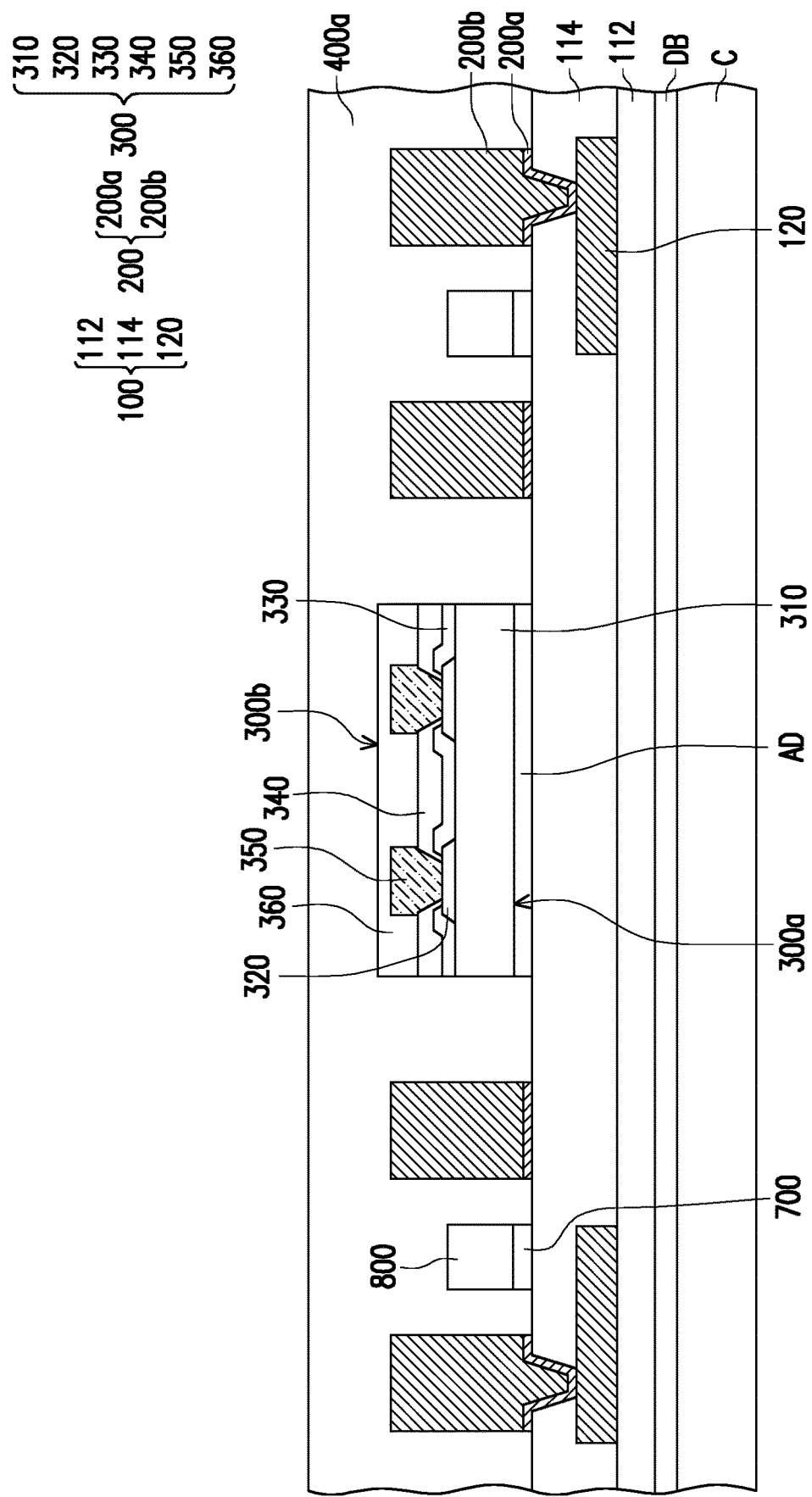
Figure 3J:
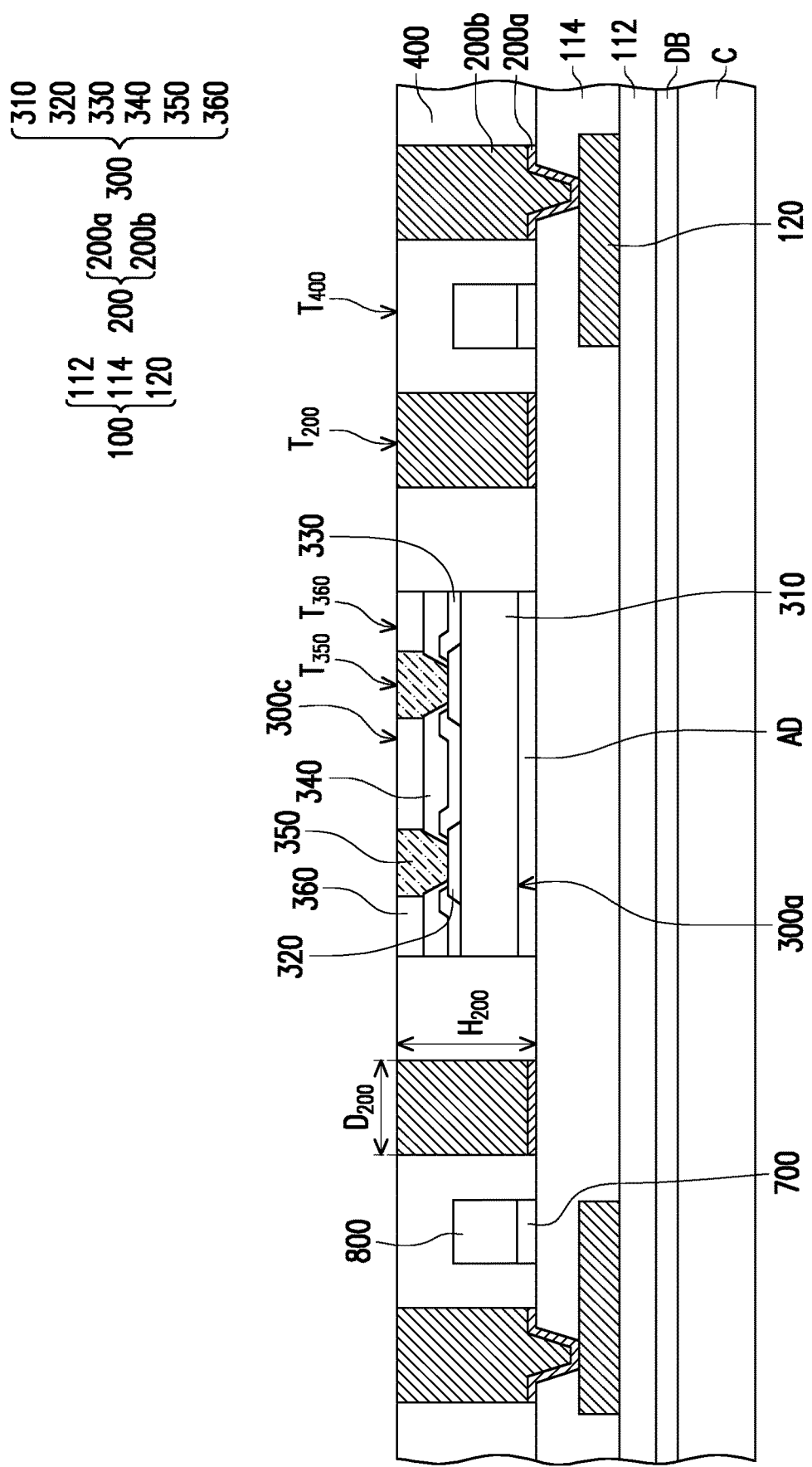
Figure 3K:
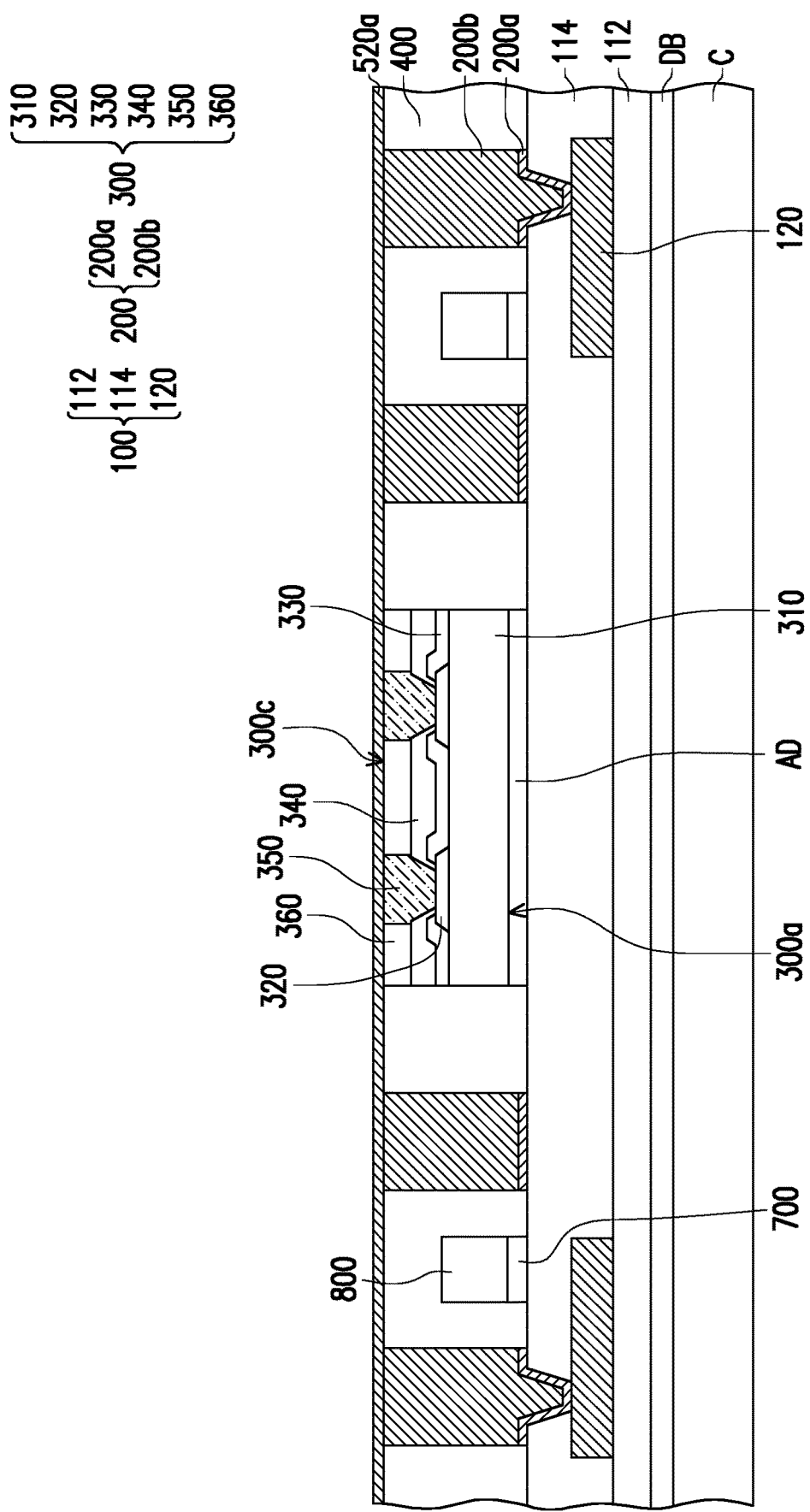
Figure 3L:
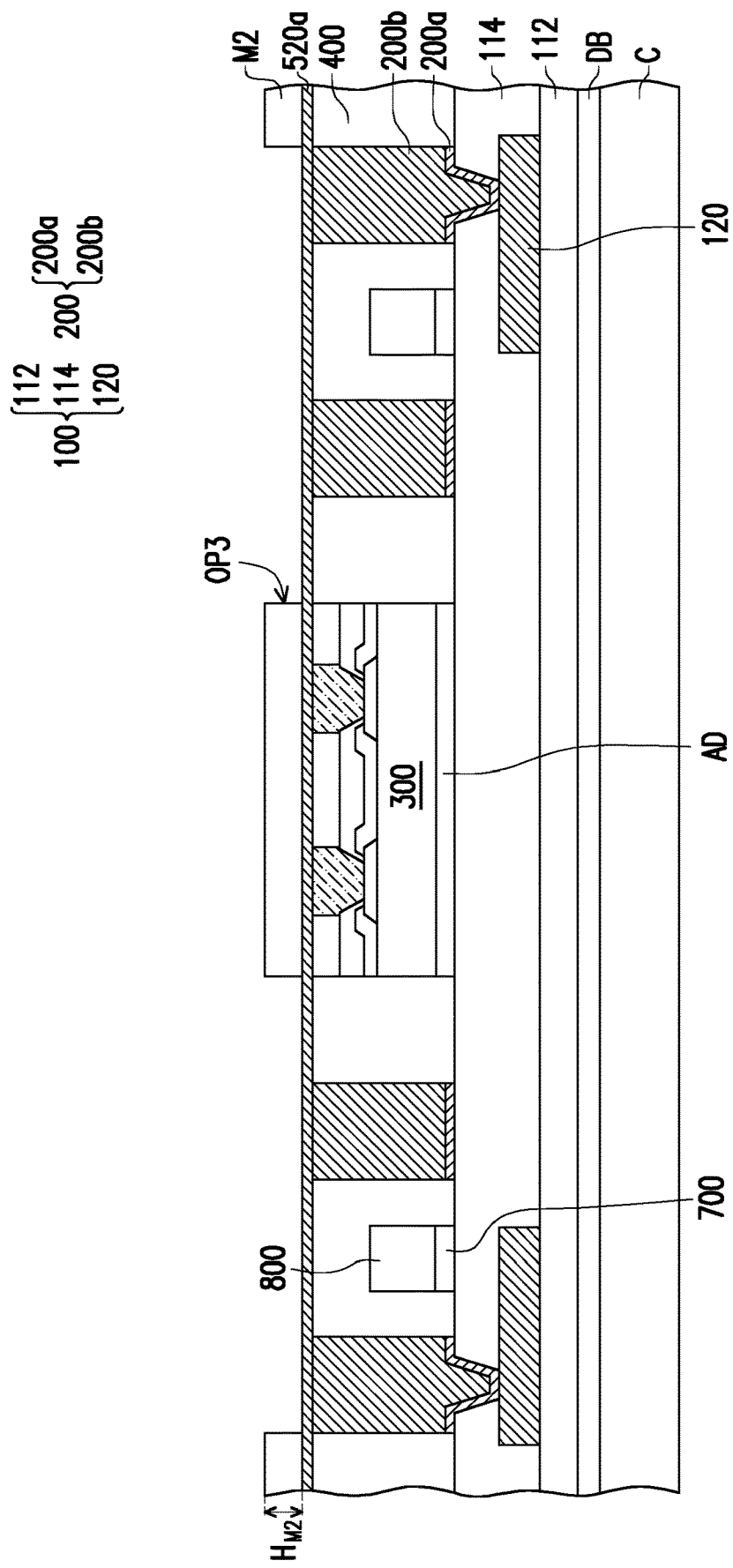
Figure 3M:
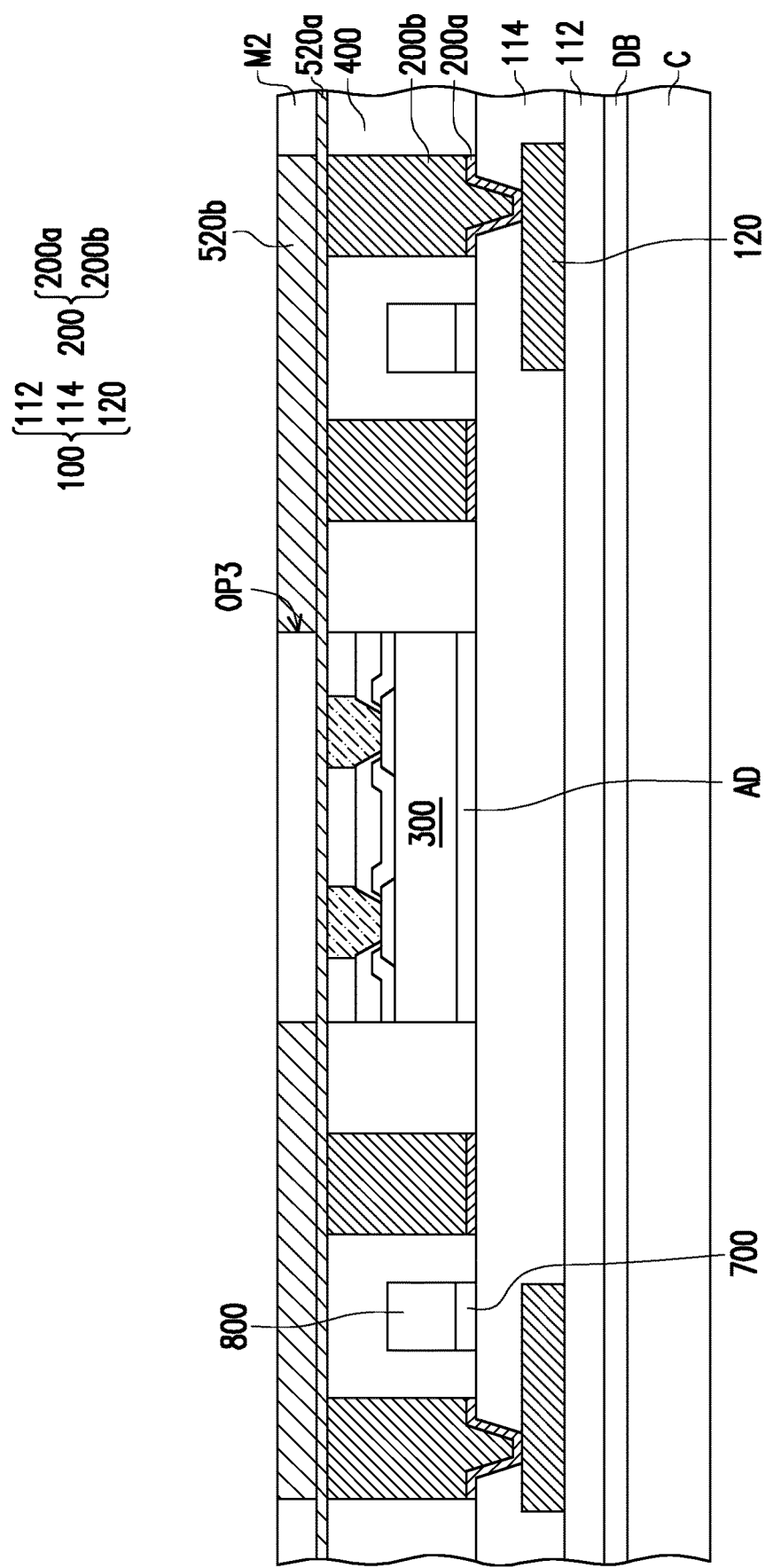
Figure 3N:
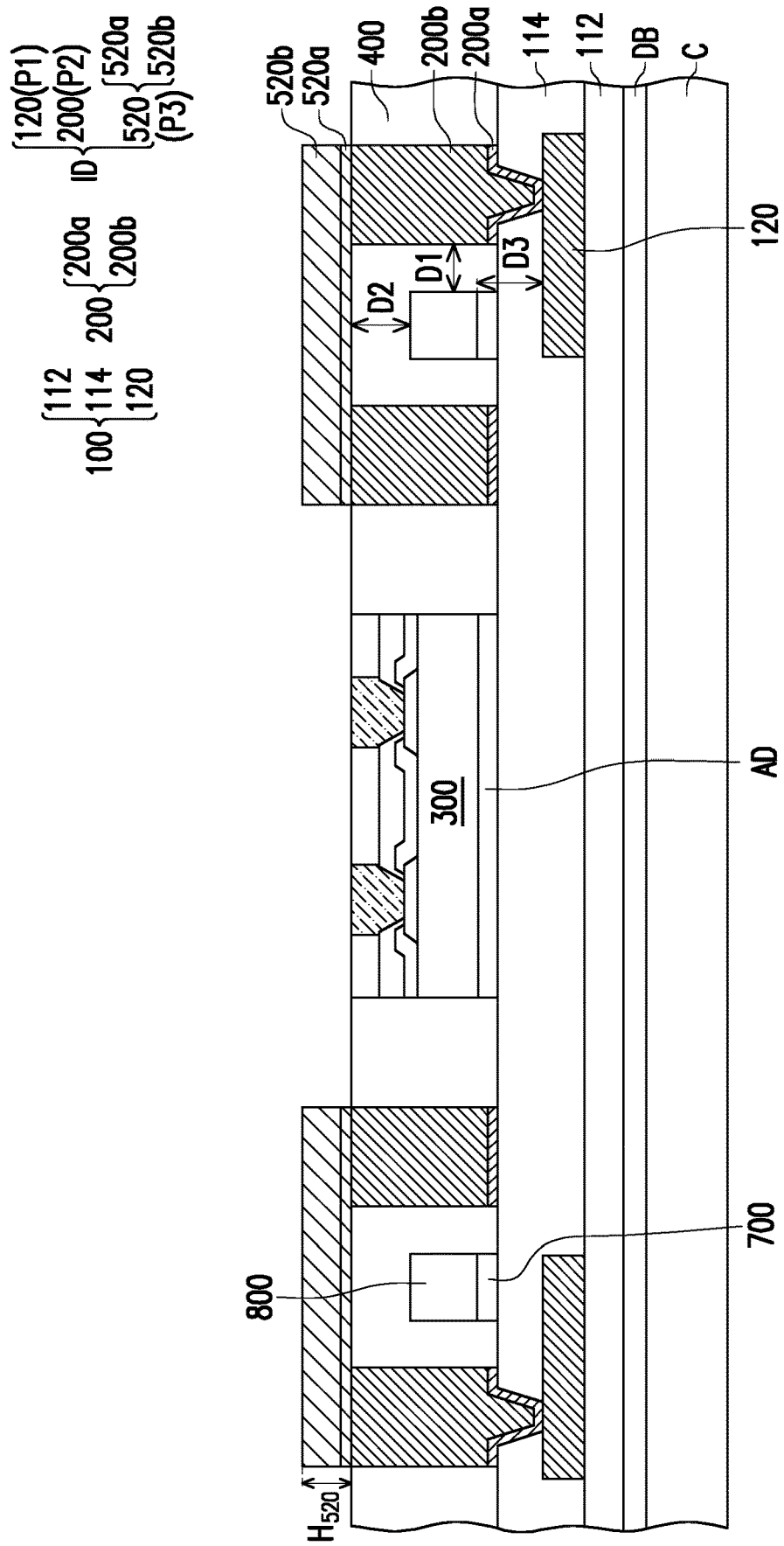
Figure 30:
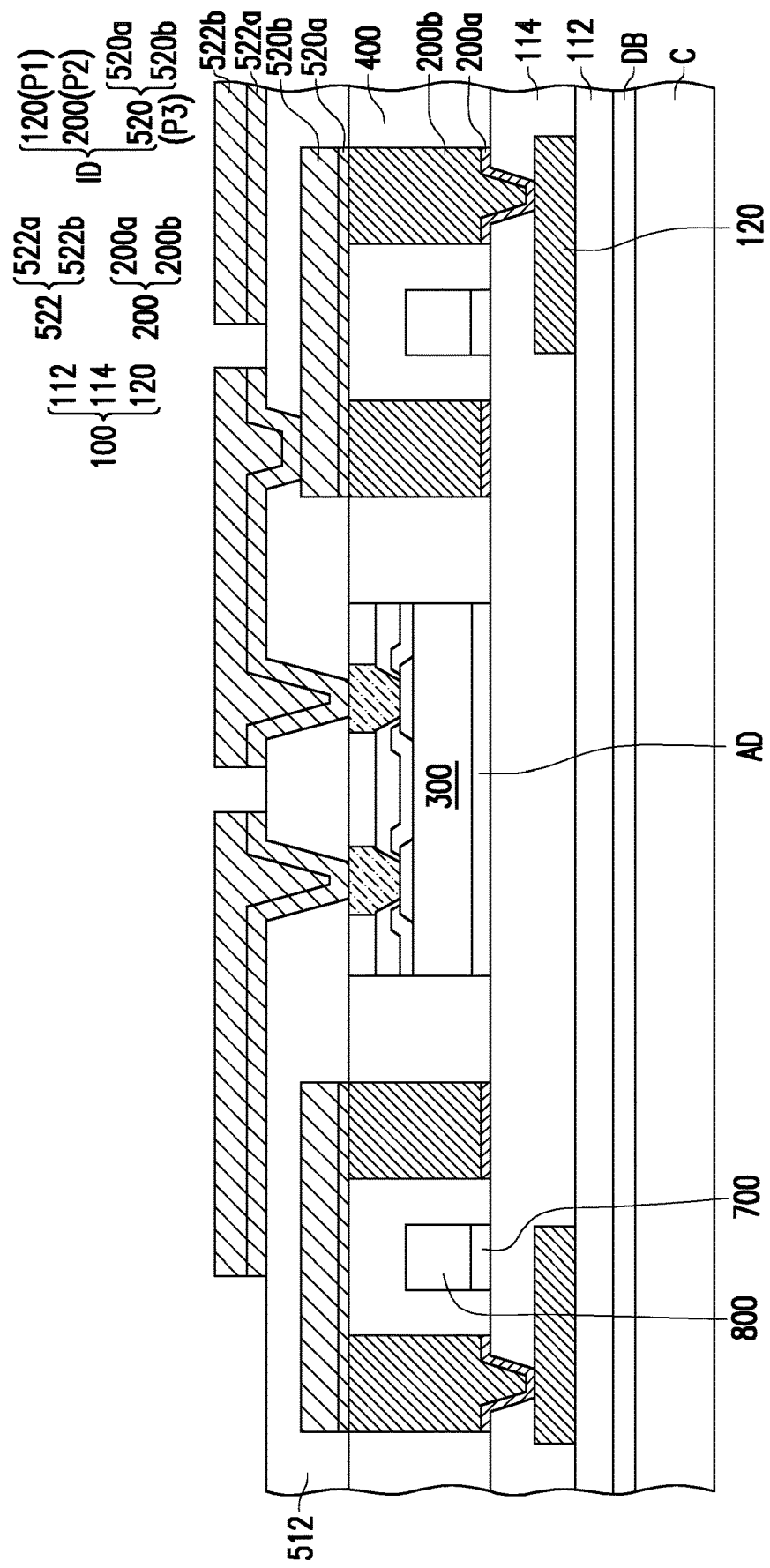
Figure 3P:
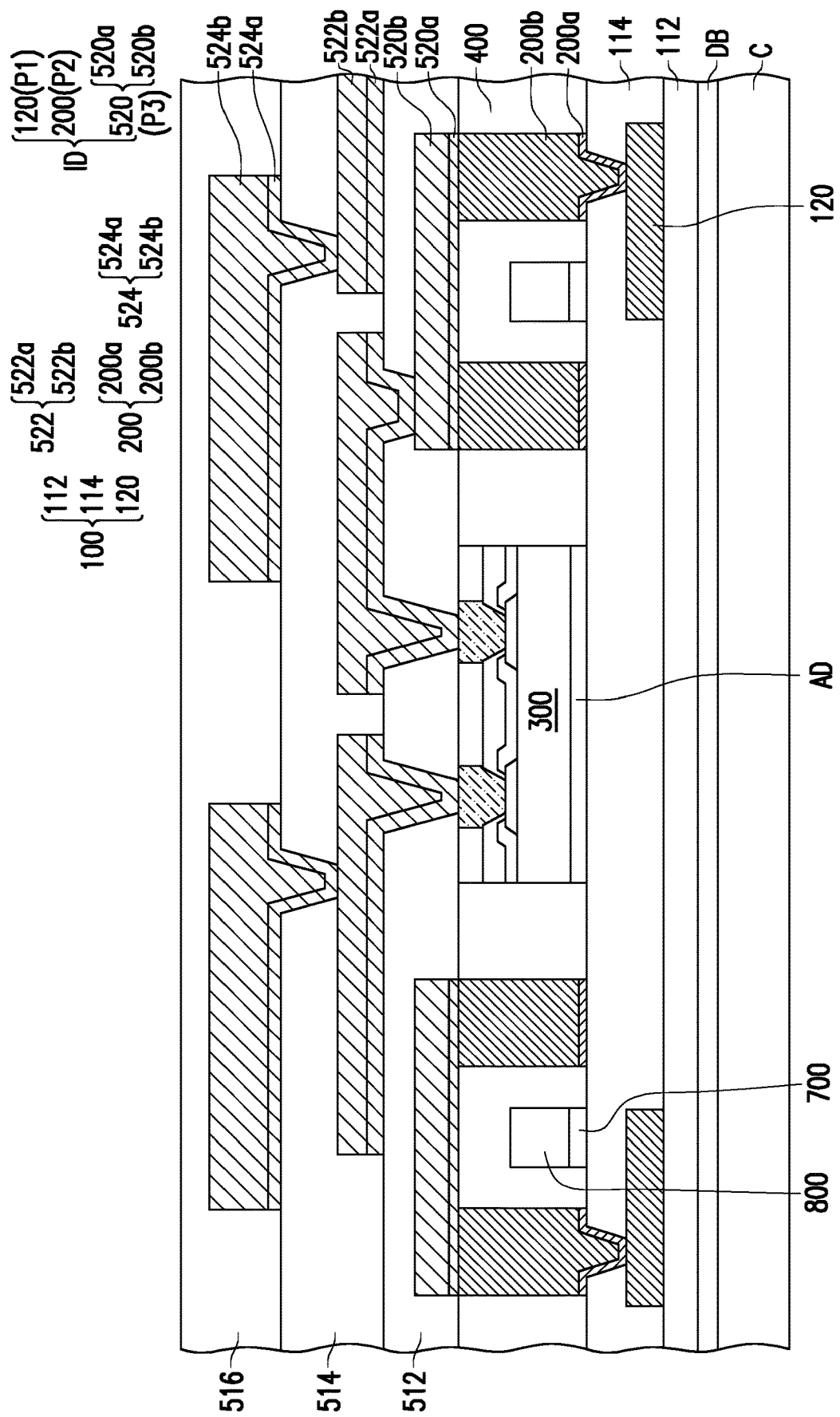
Figure 3Q:
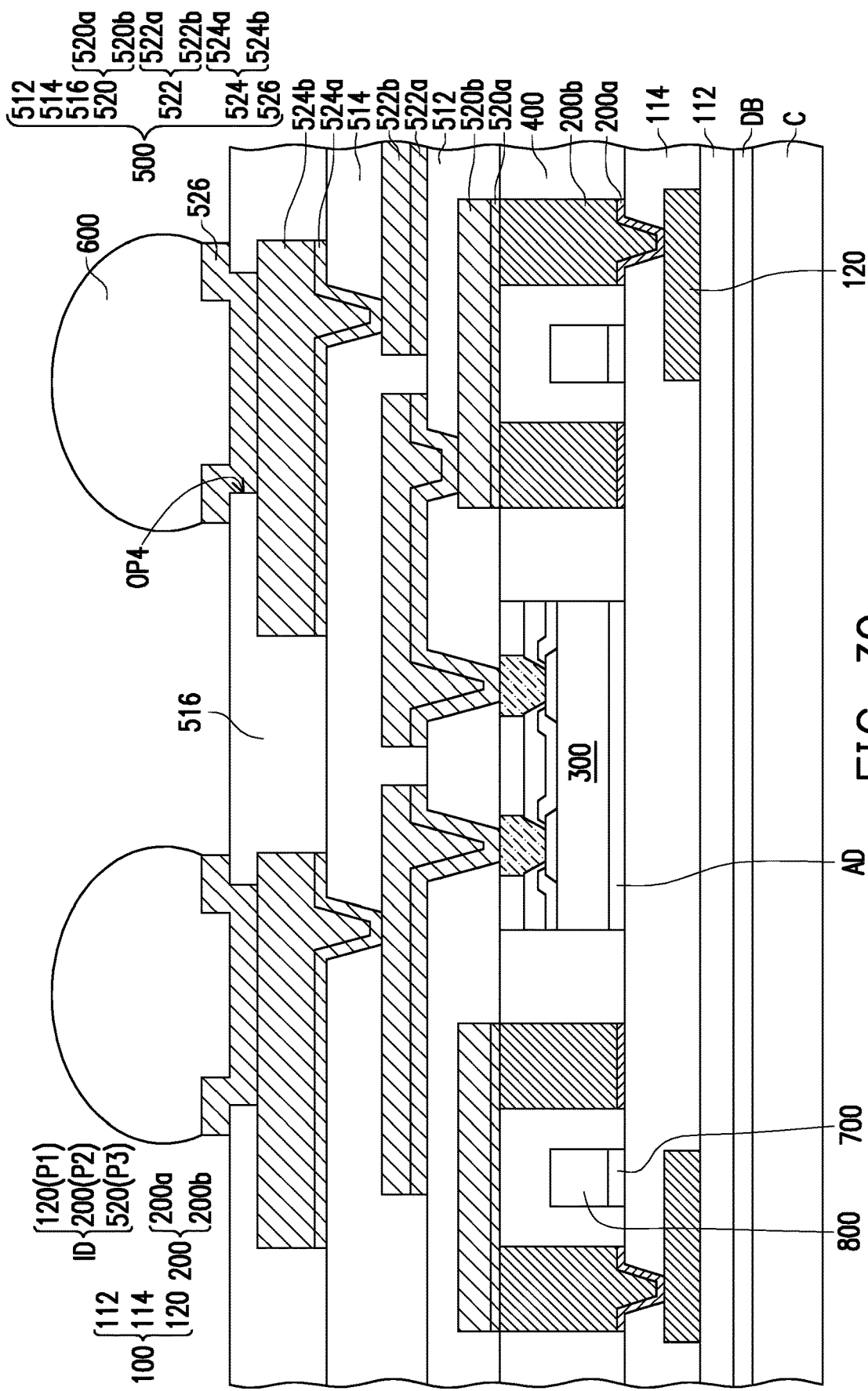
Figure 3R:
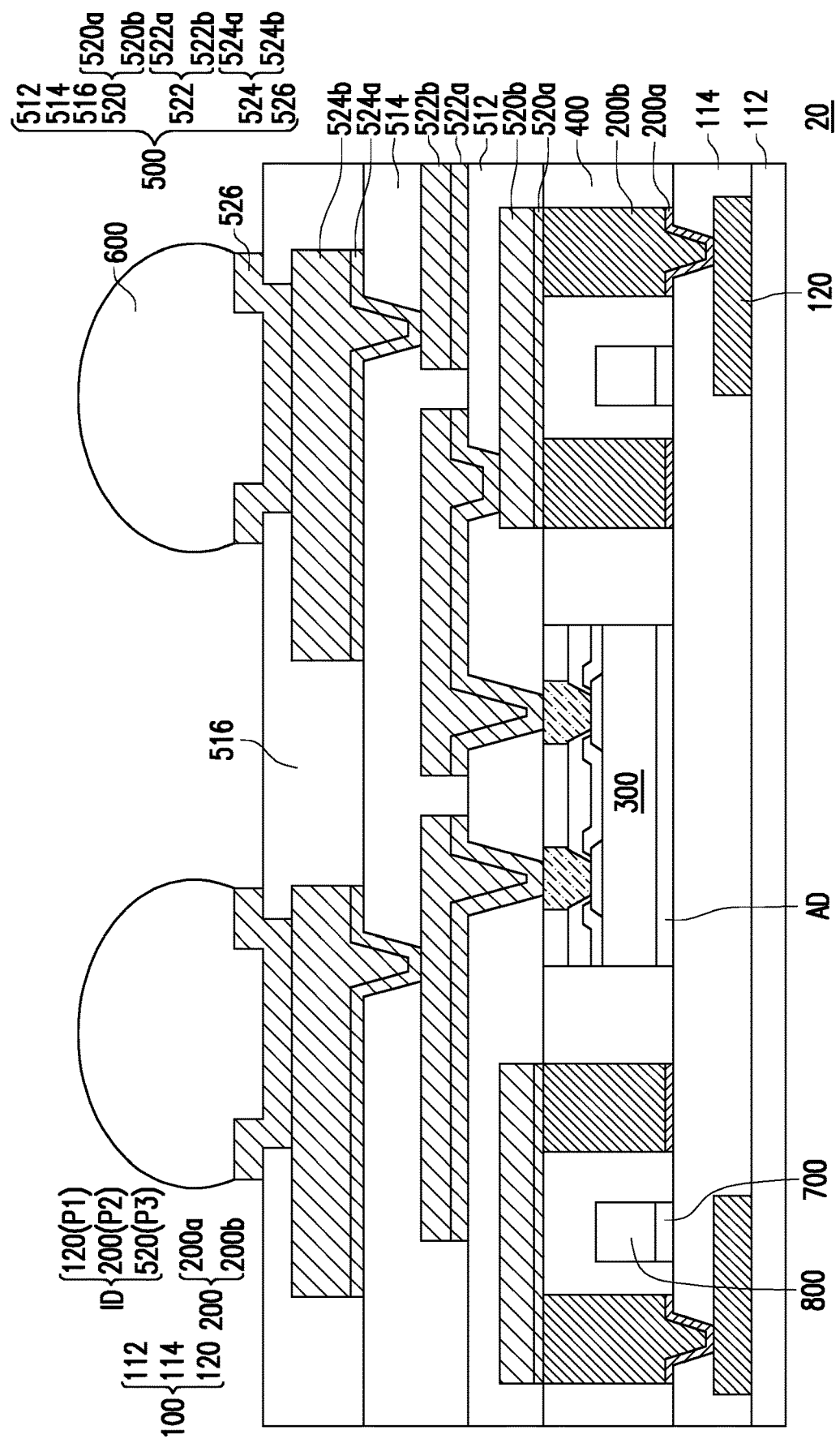

FIG. 3A to FIG. 3R are schematic cross-sectional views illustrating a manufacturing process of a package 20 in accordance with some alternative embodiments of the disclosure. Referring to FIG. 3A to FIG. 3G, the steps illustrated in FIG. 3A to FIG. 3G are similar to the steps illustrated in FIG. 1A to FIG. 1G, so the detailed descriptions thereof are omitted herein.

Referring to FIG. 3H, a plurality of dies 300 and a permalloy core 800 are formed on the first redistribution structure 100. In some embodiments, the dies 300 and the permalloy core 800 are picked-and-placed on the first redistribution structure 100. The die 300 in FIG. 3H is similar to the die 300 presented in FIG. 1H, so the detailed description thereof is omitted herein. In some embodiments, the rear surface 300a of the die 300 is attached (or adhered) to the first redistribution structure 100 through an adhesive layer AD. In some embodiments, the adhesive layer AD may include a die attach film (DAF) or other materials having adhesion property.

In some embodiments, the term "permalloy" may be referred to as "Mo-permalloy," "Mumetal," "Ultraperm," or "Super-malloy." In some embodiments, the permalloy core 800 has high magnetic permeability and low coercive force and hysteresis. For example, in some embodiments, a magnetic permeability ($\mu_m$) of the permalloy core 800 ranges between about 500 and about 1,000,000. In some embodiments, the permalloy core 800 includes Ni, Fe, Co, Mo, Si, Nb, B, or a combination thereof. For example, the permalloy core 800 may be an alloy formed by at least two of these elements. However, the disclosure is not limited thereto. In some alternative embodiments, the permalloy core 800 may be an alloy formed by at least one of the materials listed above and other materials not listed. In some embodiments, the permalloy core 800 is attached (or adhered) to the first redistribution structure 100 through an adhesive layer 700. The adhesive layer 700 may be the same as or different from the adhesive layer AD. For example, the adhesive layer 700 may include a DAF or other materials having adhesion property.

As illustrated in FIG. 3H, a height $H_{800}$ of the permalloy core 800 is less than a height $H_{200}$ of the TIVs 200. For example, the height $H_{200}$ of the TIVs 200 ranges between about 100 µm and about 250 µm while the height $H_{800}$ of the permalloy core 800 ranges between about 17 µm and about 200 µm. In some embodiments, a width $W_{800}$ of the permalloy core 800 ranges between about 50 and about 100 µm. The configuration of the permalloy core 800 with respect to the dies 300 and the TIVs 200 will be discussed below in conjunction with FIG. 4.

Figure 4:
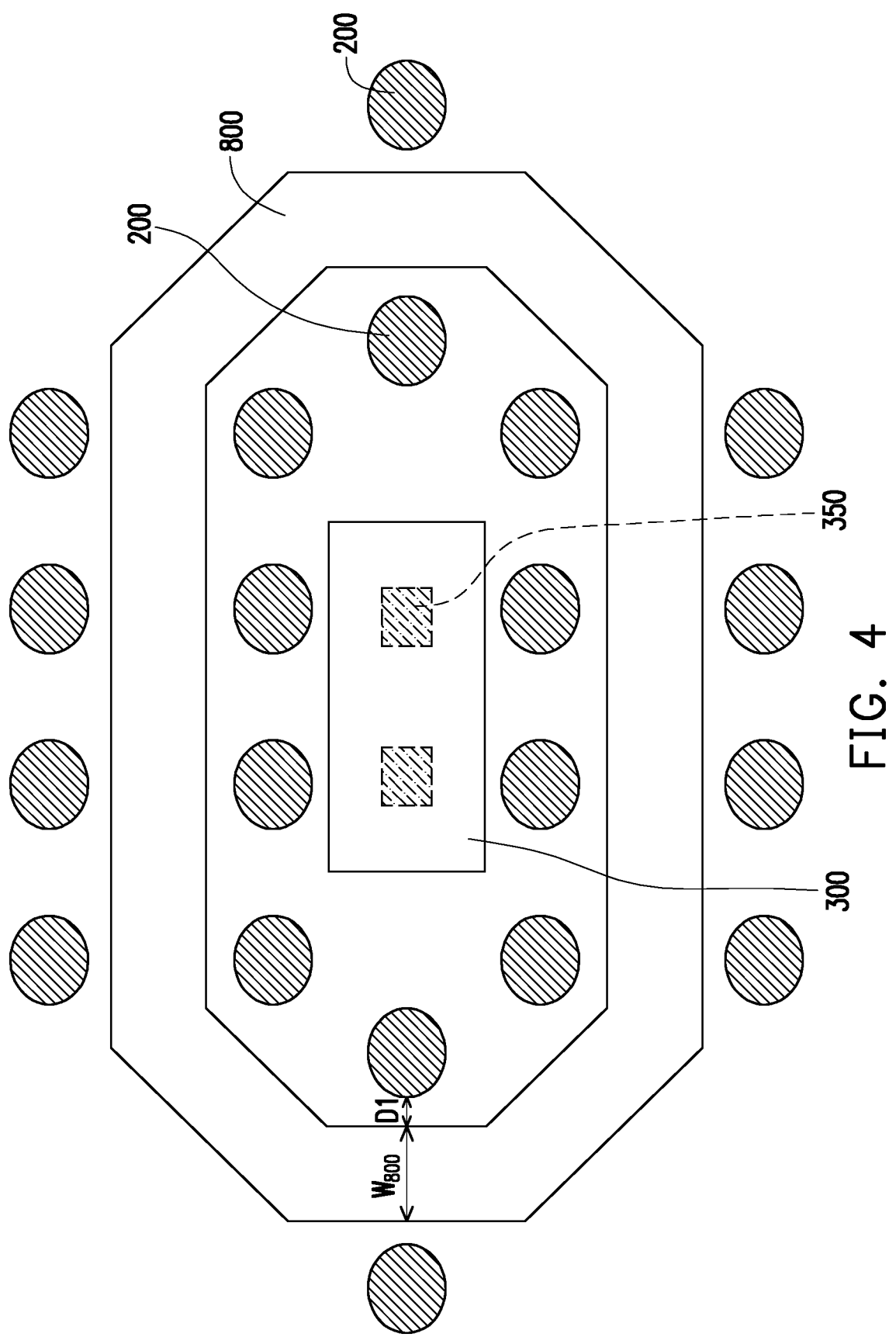
FIG. 4 is a schematic top view of FIG. 3H.

FIG. 4 is a schematic top view of FIG. 3H. Referring to FIG. 3H and FIG. 4, the permalloy core 800 may be a toroid. That is, the permalloy core 800 is shown as a ring-shaped loop from a top view to surround the die 300. On the other hand, the permalloy core 800 is surrounded by the TIVs 200. For example, the permalloy core 800 surrounds the die 300 and a portion of the TIVs 200 and is surrounded by another portion of the TIVs 200. In some embodiments, the permalloy core 800 is spaced apart from the TIVs 200. For example, a distance D1 between the permalloy core 800 and the adjacent TIV 200 in the lateral direction may range from about 5 µm to about 50 µm. It is noted that although the permalloy core 800 is shown as an octagonal loop from the top view of FIG. 4, the disclosure is not limited thereto. In some alternative embodiments, the permalloy core 800 may be shown as a squared loop, a rectangular loop, a hexagonal loop, a circular loop, or other polygonal loops from the top view.

Although FIG. 3G and FIG. 3H illustrated that the dies 300 and the permalloy core 800 are placed on the first redistribution structure 100 after the TIVs 200 are formed, the disclosure is not limited thereto. In some alternative embodiments, the dies 300 and/or the permalloy core 800 may be placed before the TIVs 200 are formed on the first redistribution structure 100.

Referring to FIG. 3I, an encapsulation material 400a is formed over the first redistribution structure 100 to encapsulate the TIVs 200, the dies 300, and the permalloy core 800. A material and a formation method of the encapsulation material 400a in FIG. 3I is similar to the encapsulation material 400a in FIG. 1I, so the detailed description thereof is omitted herein.

Referring to FIG. 3J, the encapsulation material 400a and the protection layer 360 of the dies 300 are grinded to form an encapsulant 400 over the first redistribution structure 100 to encapsulate the TIVs 200, the dies 300, and the permalloy core 800. In other words, the TIVs 200, the dies 300, and the permalloy core 800 are embedded in the encapsulant 400. A formation method of the encapsulant 400 in FIG. 3J may be similar to the encapsulant 400 in FIG. 1J, so the detailed description thereof is omitted herein.

Referring to FIG. 3K to FIG. 3N, a plurality of conductive patterns 520 is formed over the TIVs 200 and the encapsulant 400. The steps illustrated in FIG. 3K to FIG. 3N may be similar to the steps illustrated in FIG. 1K to FIG. 1N, so the detailed descriptions thereof are omitted herein. In some embodiments, at least a portion of the conductive patterns 120, at least a portion of the TIVs 200, and at least a portion of the conductive patterns 520 may be collectively referred to as an inductor ID. The configuration of the inductor ID with respect to the permalloy core 800 will be discussed below in conjunction with FIG. 5.

Figure 5:
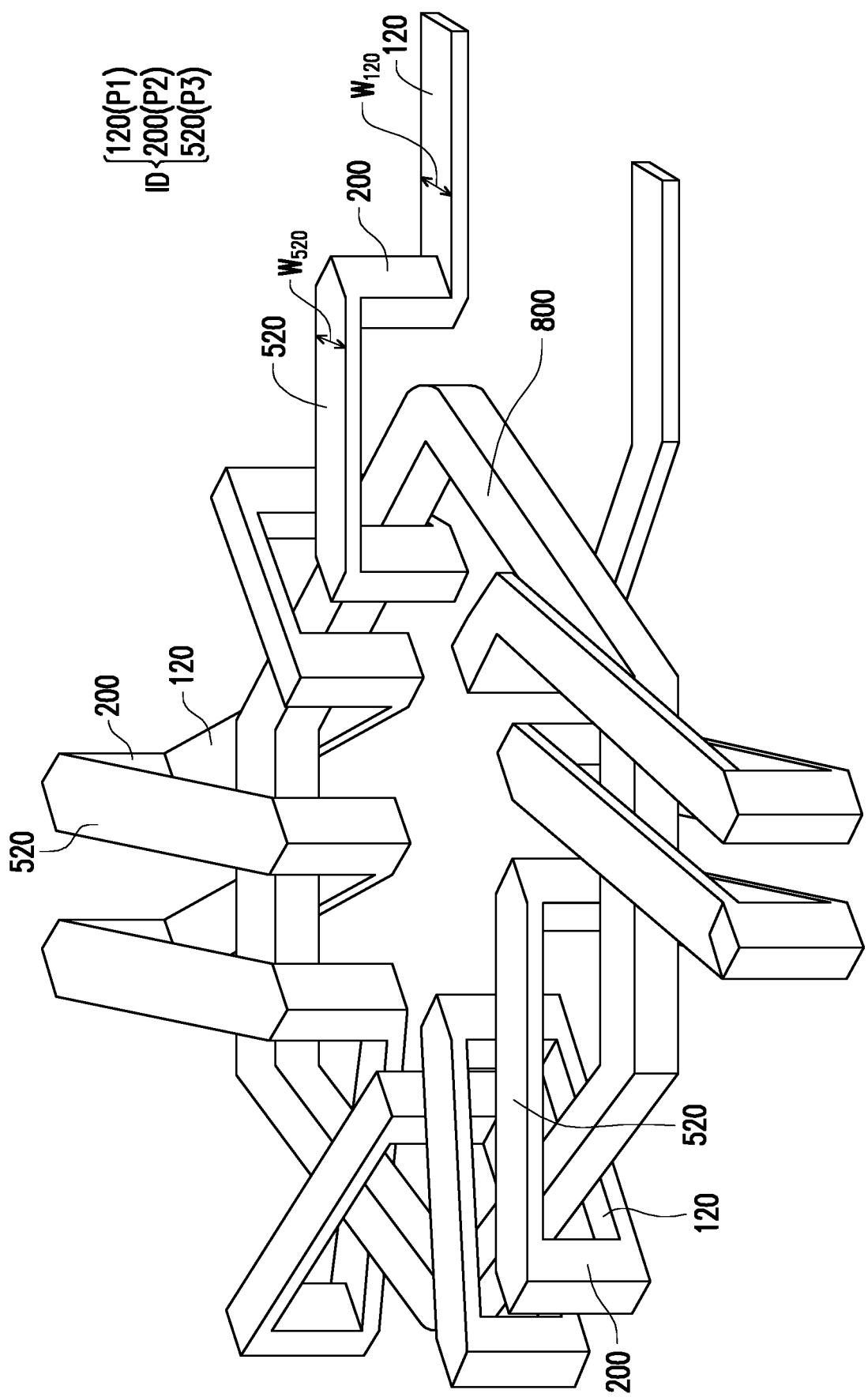
FIG. 5 is a schematic perspective view illustrating the inductor and the permalloy core in FIG. 3N.

FIG. 5 is a schematic perspective view illustrating the inductor ID and the permalloy core 800 in FIG. 3N. Referring to FIG. 3N and FIG. 5, the inductor ID may be divided into a first portion P1, a second portion P2, and a third portion P3. The first portion P1, the second portion P2, and the third portion P3 are connected to each other. For example, the first portion P1 is connected to the second portion P2, and the second portion P2 is connected to the third portion P3. In some embodiments, at least a portion of the conductive patterns 120, at least a portion of the TIVs 200, and at least a portion of the conductive patterns 520 may respectively correspond to the first portion P1, the second portion P2, and the third portion P3. That is, at least a portion of the conductive patterns 120, at least a portion of the TIVs 200, and at least a portion of the conductive patterns 520 may be respectively referred to as the first portion P1, the second portion P2, and the third portion P3. As illustrated in FIG. 1N, the first portion P1 (the conductive patterns 120) is embedded in the first redistribution structure 100. Similarly, the second portion P2 (the TIVs 200) is embedded in the encapsulant 400. On the other hand, the third portion P3 (the conductive patterns 520) is embedded in the subsequently formed second redistribution structure 500 (shown in FIG. 3Q). In some embodiments, the dies 300 are surrounded by the inductor ID, which can reduce the area cost of the subsequently formed package 10 effectively. For example, the inductor ID surrounds the dies 300 to ensure the overall compactness of the package 10.

As illustrated in FIG. 5, the first portion P1 and the second portion P2 of the inductor ID are arranged in a staggered or an end-to-end manner such that the inductor ID forms a spiral or a coil embedded within the subsequently formed package 20. For example, one end of one of the conductive patterns 120 is vertically overlapped with one end of one of the conductive patterns 520 while another end of the one of the conductive patterns 120 is vertically overlapped with one end of another one of the conductive patterns 520. That is, two ends of one of the conductive patterns 120 are respectively connected to two adjacent conductive patterns 520 through two distinct TIVs 200. In some embodiments, the conductive patterns 120 (the first portion P1) are located on a same plane. Similarly, the conductive patterns 520 (the third portion P3) are also located on a same plane. Nevertheless, the first portion P1 and the third portion P3 are located on different planes and are connected by the second portion P2.

In some embodiments, the permalloy core 800 is surrounded by the inductor ID. For example, the permalloy core 800 is inserted in the space enclosed by the spiral or the coil of the inductor ID. That is, the permalloy core 800 is confined within the space laid out by the first portion P1, the second portion P2, and the third portion P3 of the inductor ID. In some embodiments, the permalloy core 800 is located between two adjacent TIVs 200 that are connected to the same conductive pattern 520. Similarly, the permalloy core 800 is also located between two adjacent TIVs 200 that are connected to the same conductive pattern 120. In some embodiments, the permalloy core 800 is located on a plane between a plane where the conductive patterns 120 are located and a plane where the conductive patterns 520 are located. In other words, the toroidal permalloy core 800 has a ring-shaped path and the inductor ID coils around the toroid. In some embodiments, the permalloy core 800 is spaced apart from the inductor ID. As mentioned above, the distance D1 between the permalloy core 800 and the adjacent TIV 200 (the second portion P2) in the lateral direction may range from about 5 µm to about 50 µm. On the other hand, a distance D2 between the permalloy core 800 and the conductive patterns 520 located above the permalloy core 800 in the vertical direction may range from about 5 µm to about 10 µm. Furthermore, a distance D3 between the permalloy core 800 and the conductive patterns 120 located underneath the permalloy core 800 in the vertical direction may range from about 4 µm to about 8 µm.

In some embodiments, the permalloy core 800 has a magnetic permeability ($\mu_m$) ranging between about 500 and about 1,000,000 and a conductivity of about 7.41×10$^5$ siemens. On the other hand, the inductor ID has a conductivity of about 1×10$^7$ siemens to about 5.96×10$^7$ siemens. As a result, in some embodiments, the inductor ID may have an inductance of about 8 nH to about 1146.6 nH at a frequency of 1 MHz. In other words, with the high inductance derived from incorporation of permalloy core 800 within the subsequently formed package 20, the inductor ID may serve as a voltage regulator under high frequency to provide effective power management for high frequency applicable electronic devices. Meanwhile, as illustrated in FIG. 3N, since the inductor ID is integrated within the subsequently formed package 20, the compactness of the electronic device may be ensured. Furthermore, by utilizing the conductive patterns in the redistribution structures and the TIVs as portions of the inductor ID, the fabrication process of the inductor ID may be readily simplified, thereby rendering an effective and economical manufacturing process.

Referring to FIG. 3O to FIG. 3R, the steps similar to the steps presented in FIG. 1O to FIG. 1R may be performed to obtain a plurality of packages 20. In some embodiments, the package 20 may be referred to as an integrated fan-out (InFO) package. However, the disclosure is not limited thereto. In some alternative embodiments, the package 20 may be other types of packages.

In accordance with some embodiments of the disclosure, a packages includes a first redistribution structure, a die, an encapsulant, a second redistribution structure, and an inductor. The die is disposed on the first redistribution structure. The encapsulant laterally encapsulates the die. The second redistribution structure is over the die and the encapsulant. The inductor includes a first portion, a second portion, and a third portion. The first portion is embedded in the first redistribution structure. The second portion is embedded in the encapsulant and is connected to the first and third portions of the inductor. The third portion is embedded in the second redistribution structure.

In accordance with some alternative embodiments of the disclosure, a package includes a first redistribution structure, a second redistribution structure, an encapsulant, and an inductor. The first redistribution structure includes a plurality of first dielectric layers and a plurality of first conductive patterns sandwiched between the first dielectric layers. The second redistribution structure includes a plurality of second dielectric layers and a plurality of second conductive patterns embedded within the bottommost second dielectric layer. The encapsulant is located between the first redistribution structure and the second redistribution structure. The inductor includes a plurality of through insulating vias (TIV), the first conductive patterns, and the second conductive patterns. The TIVs penetrate through the encapsulant.

In accordance with some embodiments of the disclosure, a manufacturing method of a package includes at least the following steps. A first redistribution structure is formed. The first redistribution structure includes a first portion of an inductor. A plurality of through insulating vias (TIV) is formed on the first redistribution structure. The TIVs includes a second portion of the inductor. A die is placed on the first redistribution structure. The die and the TIVs are encapsulated by an encapsulant. A second redistribution structure is formed on the TIVs, the die, and the encapsulant. The second redistribution structure includes a third portion of the inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first redistribution structure;
   a die disposed on the first redistribution structure;
   an encapsulant laterally encapsulating the die;
   a second redistribution structure over the die and the encapsulant;
   an inductor, wherein the inductor comprises a first portion, a second portion, and a third portion, the first portion is embedded in the first redistribution structure, the second portion is embedded in the encapsulant and is connected to the first and third portions of the inductor, and the third portion is embedded in the second redistribution structure; and
   a permalloy core embedded in the encapsulant, wherein the permalloy core surrounds the die and is surrounded by the inductor.

2. The package according to claim 1, wherein the premalloy core comprises nickel (Ni), iron (Fe), cobalt (Co), molybdenum (Mo), silicon (Si), niobium (Nb), boron (B), or a combination thereof.

3. The package according to claim 1, wherein a magnetic permeability ($\mu_m$) of the permalloy core ranges between about 500 and about 1,000,000.

4. The package according to claim 1, wherein the permalloy core is a toroid.

5. The package according to claim 4, wherein the inductor coils around the toroid and is spaced apart from the toroid.

6. A package, comprising:
   a first redistribution structure, comprising:
      a plurality of first dielectric layers; and
      a plurality of first conductive patterns sandwiched between the plurality of first dielectric layers;
   a die disposed on the first redistribution structure;
   a second redistribution structure over the die, comprising:
      a plurality of second dielectric layers; and
      a plurality of second conductive patterns embedded within the bottommost second dielectric layer;
   an encapsulant located between the first redistribution structure and the second redistribution structure; and
   an inductor, comprising:
      a plurality of through insulating vias (TIV) penetrating through the encapsulant;
      the plurality of first conductive patterns; and
      the plurality of second conductive patterns.

7. The package according to claim 6, further comprising a permalloy core attached to the first redistribution structure through an adhesive layer, wherein the permalloy core is embedded in the encapsulant.

8. The package according to claim 7, wherein the premalloy core comprises Ni, Fe, Co, Mo, Si, Nb, B, or a combination thereof.

9. The package according to claim 7, wherein a magnetic permeability ($\mu_m$) of the permalloy core ranges between about 500 and about 1,000,000.

10. The package according to claim 7, wherein the permalloy core is a toroid.

11. The package according to claim 7, wherein a height of the permalloy core is less than a height of the plurality of TIVs, and the permalloy core is spaced apart from the inductor.

12. The package according to claim 6, wherein the second redistribution structure further comprises a plurality of routing patterns sandwiched between the plurality of second dielectric layers, and the plurality of routing patterns is electrically connected to the die and the inductor.

13. A package, comprising:
an encapsulant;
a die embedded in the encapsulant; and
an inductor surrounding the die, comprising:
　first conductive patterns and second conductive patterns disposed on opposite sides of the encapuslant; and
　through insulating vias (TIV) penetrating through the encapsulant, wherein the TIVs connect the first conductive patterns and the second conductive patterns.

14. The package according to claim 13, further comprising a permalloy core embedded in the encapsulant, wherein the permalloy core surrounds the die and is surrounded by the inductor.

15. The package according to claim 14, wherein the premalloy core comprises Ni, Fe, Co, Mo, Si, Nb, B, or a combination thereof.

16. The package according to claim 14, wherein a magnetic permeability ($\mu_m$) of the permalloy core ranges between about 500 and about 1,000,000.

17. The package according to claim 14, wherein the permalloy core is a toroid.

18. The package according to claim 17, wherein the inductor coils around the toroid.

19. The package according to claim 17, wherein the inductor is spaced apart from the toroid.

20. The package according to claim 14, wherein a height of the permalloy core is less than a height of the TIVs, and the permalloy core is spaced apart from the inductor.

* * * * *